US012754475B2

(12) United States Patent
Yoon et al.

(10) Patent No.: US 12,754,475 B2
(45) Date of Patent: Oct. 6, 2026

(54) APPARATUS FOR TREATING SUBSTRATE AND METHOD FOR TREATING A SUBSTRATE

(71) Applicant: SEMES CO., LTD., Cheonan-si (KR)

(72) Inventors: Hyun Yoon, Seoul (KR); Ki Hoon Choi, Cheonan-si (KR); Seung Un Oh, Cheonan-si (KR); Young Ho Park, Incheon (KR); Sang Hyeon Ryu, Yangpyeong-gun (KR); Tae Hee Kim, Yongin-si (KR); Sang Gun Lee, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 791 days.

(21) Appl. No.: 18/183,628

(22) Filed: Mar. 14, 2023

(65) Prior Publication Data

US 2024/0118607 A1 Apr. 11, 2024

(30) Foreign Application Priority Data

Oct. 11, 2022 (KR) ........................ 10-2022-0129373

(51) Int. Cl.
*G03F 1/80* (2012.01)
*B08B 3/12* (2006.01)
(Continued)

(52) U.S. Cl.
CPC .................. *G03F 1/80* (2013.01); *B08B 3/12* (2013.01); *B08B 13/00* (2013.01); *G03F 1/82* (2013.01);
(Continued)

(58) Field of Classification Search
None
See application file for complete search history.

(56) References Cited

U.S. PATENT DOCUMENTS 6,071,376 A * 6/2000 Nagamura ................ G03F 1/82 134/1.1
2023/0168586 A1 * 6/2023 Choi ....................... G03F 7/709 134/113

FOREIGN PATENT DOCUMENTS

KR 10-2011-0021291 A 3/2011
KR 10-2017-0020192 A 2/2017
(Continued)

OTHER PUBLICATIONS

Korean Office Action dated Nov. 20, 2024 issued in corresponding Korean Patent Appln. No. 10-2022-0129373.

*Primary Examiner* — Jiong-Ping Lu
(74) *Attorney, Agent, or Firm* — Harness, Dickey & Pierce, P.L.C.

(57) ABSTRACT

The inventive concept provides a substrate treating method. The substrate treating method includes pre-treating a substrate by cleaning the substrate; etching the substrate by supplying an etchant and heating a substrate supplied with the etchant; and post-treating the substrate after the etching the substrate, and wherein the pre-treating the substrate, the etching the substrate, and the post-treating the substrate are each performed in different chambers, a substrate on which the pre-treating the substrate is completed is transferred in a dry state to a chamber at which the etching the substrate is performed, and a substrate on which the etching the substrate is completed is transferred in a wetted state with a liquid to a chamber at which the post-treating the substrate is performed.

19 Claims, 28 Drawing Sheets

(51) Int. Cl.

| | |
|---|---|
| ***B08B 13/00*** | (2006.01) |
| ***G03F 1/82*** | (2012.01) |
| ***G03F 7/00*** | (2006.01) |
| ***G03F 7/16*** | (2006.01) |
| ***G03F 7/20*** | (2006.01) |
| ***G03F 7/30*** | (2006.01) |
| ***G03F 7/40*** | (2006.01) |
| ***H10P 50/64*** | (2026.01) |
| ***H10P 70/00*** | (2026.01) |
| ***H10P 72/00*** | (2026.01) |
| ***H10P 72/30*** | (2026.01) |
| ***H10P 76/20*** | (2026.01) |

(52) U.S. Cl.

CPC .............. *G03F 7/168* (2013.01); *G03F 7/202* (2013.01); *G03F 7/30* (2013.01); *G03F 7/3014* (2013.01); *G03F 7/3021* (2013.01); *G03F 7/3057* (2013.01); *G03F 7/3064* (2013.01); *G03F 7/40* (2013.01); *G03F 7/70733* (2013.01); *G03F 7/70775* (2013.01); *H10P 50/642* (2026.01); *H10P 50/644* (2026.01); *H10P 70/00* (2026.01); *H10P 72/0402* (2026.01); *H10P 72/0404* (2026.01); *H10P 72/0408* (2026.01); *H10P 72/0411* (2026.01); *H10P 72/0422* (2026.01); *H10P 72/32* (2026.01); *H10P 76/2041* (2026.01)

(56) References Cited

FOREIGN PATENT DOCUMENTS

| | | | | |
|---|---|---|---|---|
| KR | 10-2019-0037479 A | | 4/2019 | |
| KR | 10-2020-0075531 A | | 6/2020 | |
| WO | WO2007030476 | * | 3/2007 | ............... G03F 1/00 |

* cited by examiner

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0129373 filed on Oct. 11, 2022, in the Korean Intellectual Property Office, the entire contents of which are hereby incorporated by reference.

TECHNICAL FIELD

Embodiments of the inventive concept described herein relate to a substrate treating apparatus and a substrate treating method, more specifically, a substrate treating apparatus and a substrate treating method for heating a substrate to treat the substrate.

BACKGROUND

Embodiments of the inventive concept described herein relate to a substrate treating apparatus and a substrate treating method, more specifically, a substrate treating apparatus and a substrate treating method for heating a substrate to treat the substrate.

A photolithography process for forming a pattern on a wafer includes an exposure process. The exposure process is a preliminary operation for cutting a semiconductor integrated material attached to the wafer into a desired pattern. The exposure process may have various purposes, such as forming a pattern for etching and forming a pattern for an ion implantation. The exposure process uses a mask, which is a kind of 'frame', to draw a pattern with a light on the wafer. If the light is exposed to the semiconductor integrated material on the wafer, such as a photoresist on the wafer, chemical properties of the photoresist change according to the pattern by the light and the mask. If a developer is supplied to the photoresist which chemical properties have changed according to the pattern, the pattern is formed on the wafer.

In order to accurately perform the exposure process, the pattern formed on the mask must be precisely manufactured. It should be checked whether the pattern is formed to satisfy the required process conditions. A large number of patterns are formed in one mask. Accordingly, it takes a lot of time for an operator to inspect all of the large number of patterns in order to inspect one mask. Accordingly, a monitoring pattern capable of representing one pattern group including a plurality of patterns is formed on the mask. In addition, an anchor pattern capable of representing a plurality of pattern groups is formed on the mask. The operator may estimate an amount of patterns included in one pattern group through an inspection of the monitoring pattern. In addition, the operator may estimate an amount of patterns formed on the mask through an inspection of the anchor pattern.

In addition, in order to increase an inspection accuracy of the mask, it is preferable that critical dimensions of the monitoring pattern and the anchor pattern are the same. A critical dimension correction process for precisely correcting critical dimensions of patterns formed on the mask is additionally performed.

FIG. 1 shows a normal distribution of a first critical dimension CDP1 of the monitoring pattern of the mask and a second critical dimension CDP2 of the anchor pattern before the critical dimension correction process is performed during a mask manufacturing process. In addition, the first critical dimension CDP1 and the second critical dimension CDP2 have a size smaller than a target critical dimension. Before the critical dimension correction process is performed, the critical dimension CD of the monitoring pattern and the anchor pattern is intentionally deviated. And, by additionally etching the anchor pattern in the critical dimension correction process, the critical dimensions of the two patterns are made the same. If the anchor pattern is etched more than the monitoring pattern in a process of additionally etching the anchor pattern, the critical dimension of the patterns formed on the mask cannot be accurately corrected due to a difference between the monitoring pattern and the anchor pattern. When additionally etching the anchor pattern, a precise etching of the anchor pattern must be accompanied.

In order to precisely etch the anchor pattern, it is assumed that foreign substances such as particles are not attached to the mask. Accordingly, before etching the anchor pattern, foreign substances attached to the mask must be removed from the mask. In addition, a large amount of process impurities are generated in a process of targeting and etching the anchor pattern. The generated process impurities or the like may be attached to the mask and cause treating defects in subsequent processes.

SUMMARY

Embodiments of the inventive concept provide a substrate treating apparatus and method for precisely etching a substrate.

Embodiments of the inventive concept provide a substrate treating apparatus and method for precisely etching a specific region of a substrate by firstly removing foreign substances and the like on the substrate from the substrate.

Embodiments of the inventive concept provide a substrate treating apparatus and method for minimizing a substrate treating defect in subsequent processes after a specific region of a substrate is etched.

The technical objectives of the inventive concept are not limited to the above-mentioned ones, and the other unmentioned technical objects will become apparent to those skilled in the art from the following description.

The inventive concept provides a substrate treating method. The substrate treating method includes a pre-treating a substrate by cleaning the substrate; etching the substrate by supplying an etchant and heating a substrate supplied with the etchant; and post-treating the substrate after the etching the substrate, and wherein the pre-treating the substrate, the etching the substrate, and the post-treating the substrate are each performed in different chambers, a substrate on which the pre-treating the substrate is completed is transferred in a dry state to a chamber at which the etching the substrate is performed, and a substrate on which the etching the substrate is completed is transferred in a wetted state with a liquid to a chamber at which the post-treating the substrate is performed.

In an embodiment, the etching the substrate includes locally irradiating a laser to a specific region of the substrate in a state at which the etchant remains on the substrate to etch the specific region of the substrate, and then replacing an etchant remaining on the substrate by supplying a rinsing liquid to the substrate.

In an embodiment, the pre-treating the substrate includes: hydrophilizing the substrate by supplying a first treating liquid to the substrate; removing a treatment residue generated from the substrate at the hydrophilizing the substrate by supplying a second treating liquid to the substrate; and In an embodiment, drying the substrate, and wherein the hydrophilizing the substrate, the removing the treatment residue, and the drying the substrate are each performed in different chambers.

In an embodiment, the post-treating the substrate includes: supplying the second treating liquid to the substrate, applying an ultrasound to a substrate having the second treating liquid remaining thereon, to remove the rinsing liquid and an etching residue generated at the etching the substrate from the substrate.

In an embodiment, the post-treating the substrate includes: supplying the rinsing liquid after supplying the second treating liquid to the substrate to replace the second treating liquid with the rinsing liquid, and supplying an organic solvent to the substrate after supplying the rinsing liquid to dry the substrate.

In an embodiment, at the hydrophilizing the substrate, the rinsing liquid is supplied to replace the first treating liquid with the rinsing liquid after the first treating liquid is supplied to the substrate, at the removing the treatment residue, the rinsing liquid is supplied to replace the second treating liquid with the rinsing liquid after the second treating liquid is supplied to the substrate, and a substrate which is wetted with the rinsing liquid is transferred from a chamber at which the hydrophilizing the substrate is performed to a chamber at which the removing the treatment residue is performed.

In an embodiment, a substrate which is wetted with the rinsing liquid is transferred from a chamber at which the removing the treatment residue is performed to a chamber at which the drying the substrate is performed.

In an embodiment, the removing the treatment residue includes applying an ultrasound to a substrate at which the second treating liquid remains after the second treating liquid is supplied to the substrate.

In an embodiment, the etching the substrate includes supplying the second treating liquid to the substrate and applying an ultrasound to the substrate at which the second treating liquid remains, and re-supplying the rinsing liquid to replace the second treating liquid, after the rinsing liquid is supplied to the substrate, and the post-treating the substrate includes: supplying an organic solvent to the substrate at which the rinsing liquid remains to dry the substrate.

In an embodiment, the first treating liquid, the second treating liquid, and the rinsing liquid each are supplied to a rotating substrate, and the first treating liquid includes an acid, the second treating liquid includes a hydrogen peroxide ($H_2O_2$), and the rinsing liquid includes a deionized water or a deionized carbon dioxide.

The inventive concept provides a substrate treating method. The substrate treating method includes a checking a position information of a plurality of patterns formed on a substrate; supplying an etchant to the substrate; heating a specific pattern among the plurality of patterns in a state of which the etchant remains on the substrate; supplying a rinsing liquid to the substrate; and post-treating by transferring a substrate on which the rinsing liquid has been supplied to a separate chamber to supply a liquid on the substrate, and to apply an ultrasound to a substrate having the liquid remaining thereon.

In an embodiment, the checking the position information includes checking a position information of the specific pattern formed on the substrate.

In an embodiment, the substrate treating method further includes pre-treating which is performed before the checking the position information is performed, and wherein the pre-treating includes: hydrophilizing the substrate by supplying a first treating liquid to the substrate, and removing a treatment residue generated during a process of supplying the first treating liquid by supplying a second treating liquid.

In an embodiment, the pre-treating includes: applying the ultrasound to a substrate at which the second treating liquid remains, and drying the substrate by supplying an organic solvent to a rotating substrate.

In an embodiment, the supplying the first treating liquid, the supplying the second treating liquid, and the supplying the organic solvent of the pre-treating are each performed in different chambers, and the checking the position information, the supplying the etchant, the heating the specific pattern, the supplying the rinsing liquid are performed in a same chamber.

In an embodiment, the heating the specific pattern includes irradiating a laser to the specific pattern.

In an embodiment, the substrate is a mask, and the mask has a first pattern and a second pattern which is different from the first pattern, and the first pattern is formed within a plurality of cells which are formed on the mask, and the second pattern is formed outside of the plurality of cells, and the specific pattern is the second pattern.

In an embodiment, the mask further includes a reference mark formed at an edge of the mask, and the checking the position information checks a position information of the reference mark, and checks a position information of the second pattern with reference to the position information of the reference mark.

In an embodiment, the post-treating applies the ultrasound to the substrate at which the liquid remains, and supplies the rinsing liquid and the organic solvent sequentially to the substrate.

The inventive concept provides a substrate treating apparatus. The substrate treating apparatus includes a first chamber for supplying a first treating liquid and a rinsing liquid to a substrate to hydrophilize the substrate; a second chamber for supplying a second treating liquid and the rinsing liquid to remove a residue remaining on the substrate; a third chamber for drying the substrate by supplying an organic solvent on the substrate; a fourth chamber for etching a specific region on the substrate; a fifth chamber for supplying at least one liquid to the substrate; and a transfer robot for transferring the substrate between the first chamber to the fifth chamber, and wherein the fourth chamber includes: a support unit configured to support the substrate; a treating liquid supply unit for supplying the second treating liquid to a substrate supported on the support unit; a rinsing liquid supply unit for supplying the rinsing liquid to the substrate supported on the support unit; a laser unit configured to irradiate a laser to the specific region of the substrate supported on the support unit; and an imaging unit configured to check a position information of the specific region of the substrate supported on the support unit, and wherein the transfer unit transfers a substrate which is wetted with the rinsing liquid from the first chamber to the second chamber, transfers a substrate which is wetted with the rinsing liquid from the second chamber to the third chamber, transfers a substrate which is dried from the third chamber to the fourth chamber, and transfers a substrate which is wetted with the rinsing liquid from the fourth chamber to the fifth chamber.

According to an embodiment of the inventive concept, a specific region of a substrate may be precisely etched.

According to an embodiment of the inventive concept, a substrate may be efficiently treated in an optical environment required by each process by treating the substrate in a separate chamber for each process.

According to an embodiment of the inventive concept, foreign substances on the substrate may be preliminarily removed, to precisely etch a specific region of the substrate in an optical state.

According to an embodiment of the inventive concept, etching residue on the substrate may be removed afterward, to treat the substrate in the optimal state in the post-process after a specific region of the substrate is etched.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
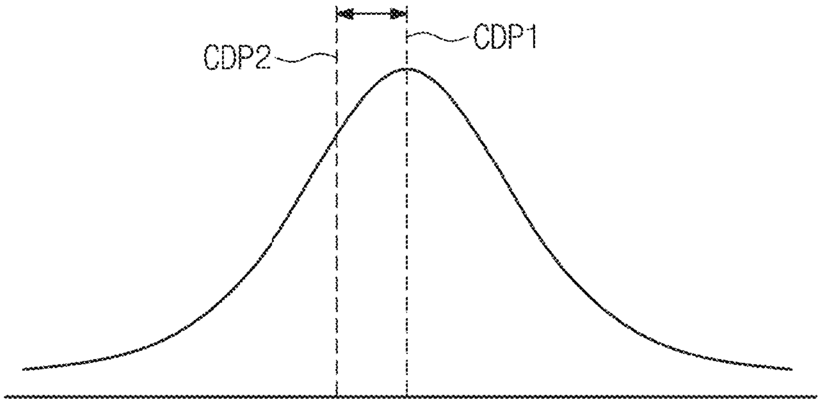
FIG. 1 illustrates a normal distribution of a critical dimension of a monitoring pattern and a critical dimension of an anchor pattern.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
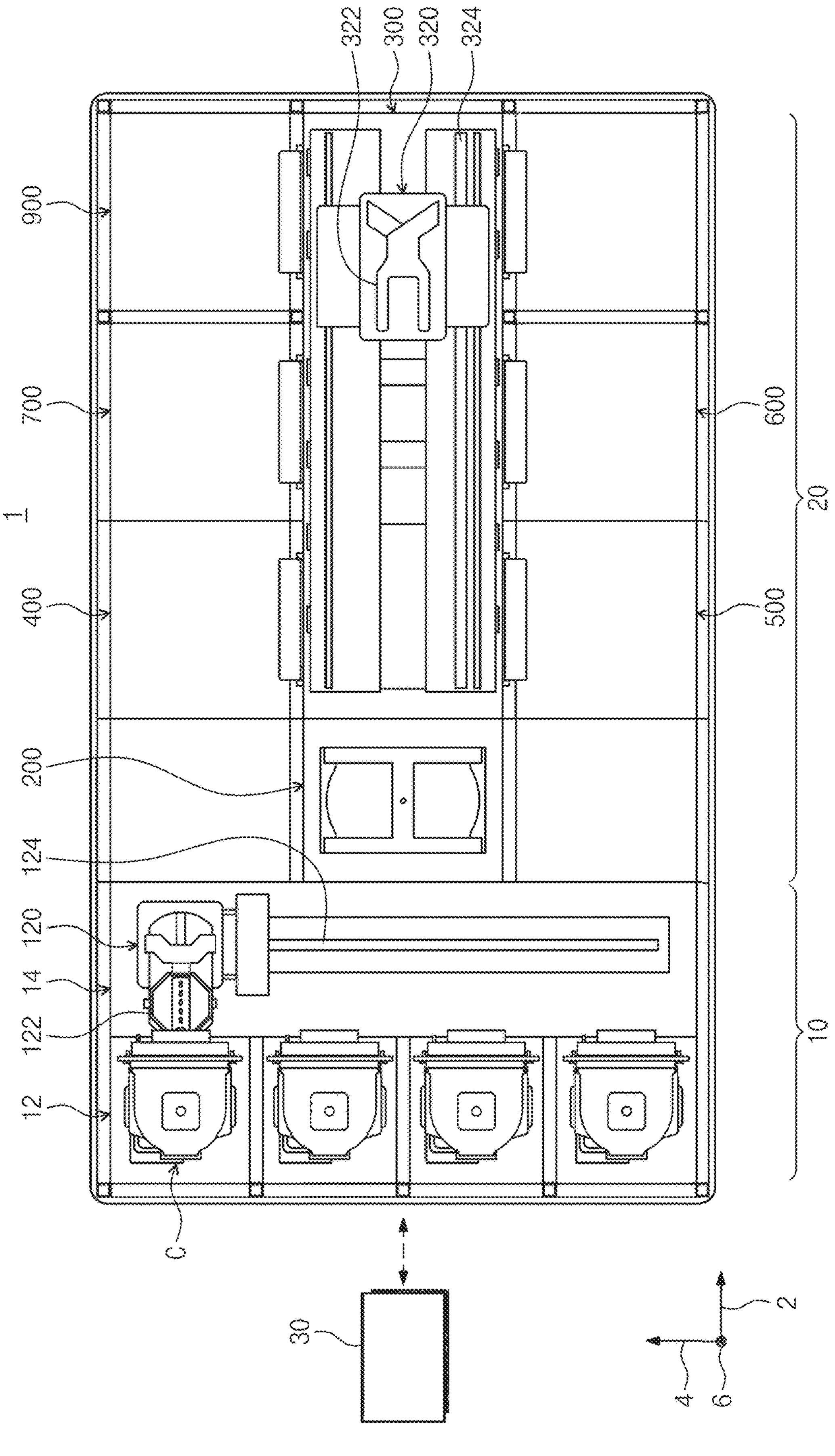
FIG. 2 is a plan view schematically illustrating a substrate treating apparatus according to an embodiment.
Figure 3:
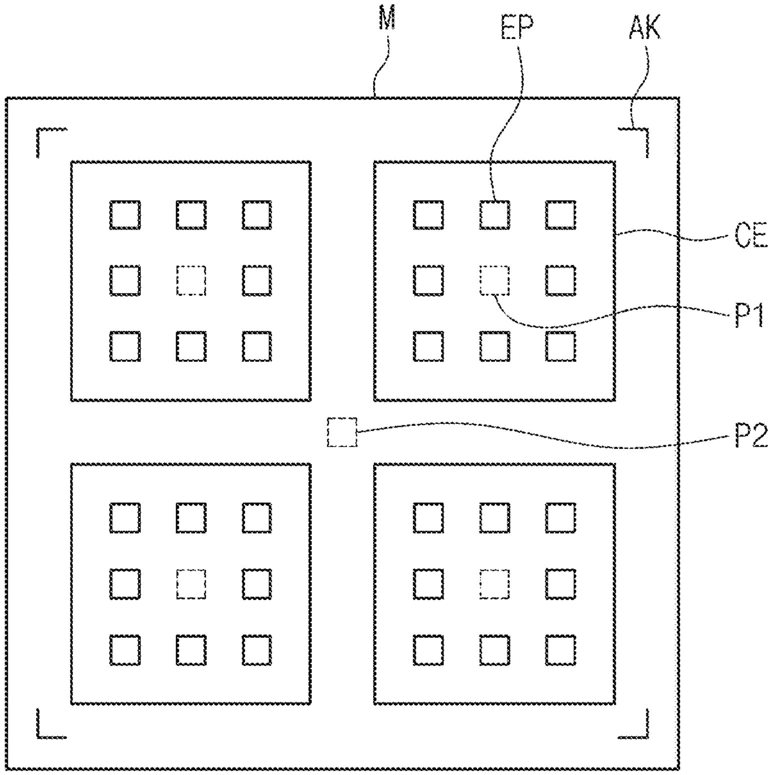
FIG. 3 is a view of a substrate according to an embodiment as viewed from above.

FIG. 2 is a plan view schematically illustrating a substrate treating apparatus according to an embodiment. FIG. 3 is a view of a substrate according to an embodiment as viewed from above.

The substrate treating apparatus 1 includes an index module 10, an index module 20, a treating module 20, and a controller 30. According to an embodiment, the index module 10 and the treating module 20 may be disposed in a direction. Hereinafter, a direction in which the index module 10 and the treating module 20 are disposed is defined as a first direction 2. Also, when viewed from above, a direction perpendicular to the first direction 2 is defined as a second direction 4, and a direction perpendicular to a plane including both the first direction 2 and the second direction 4 is defined as a third direction 6. For example, the third direction 6 may be a direction perpendicular to the ground.

The index module 10 transfers the substrate M. More specifically, the index module 10 transfers the substrate M between the container F in which the substrate M is stored and the treating module 20. The index module 10 has a lengthwise direction parallel to the second direction 4.

The index module 10 has a load port 12 and an index frame 14. A container F in which the substrate M is stored is mounted on the load port 12. The load port 12 may be disposed on an opposite side of the treating module 20 based on the index frame 14. A plurality of load ports 12 may be provided. The plurality of load ports 12 are arranged in a line along the second direction 4. The number of load ports 12 may increase or decrease according to a process efficiency and footprint conditions of the treating module 20.

The container F may be a sealed container such as a front opening unified pod (FOUP). The container F may be placed in the load port 12 by means of transfer (not shown) such as an overhead transfer, an overhead conveyor, or an automatic guided vehicle, or by an operator.

The index frame 14 has a transfer space for transferring the substrate M. An index robot 120 and an index rail 124 are disposed in the transfer space of the index frame 14. The index robot 120 transfers the substrate M between an index module 10 and a buffer unit 200 to be described later. The index robot 120 has a plurality of index hands 122. The substrate M is placed on the index hand 122. The index hand 122 may forwardly and backwardly move, rotate around the third direction 6 as an axis, and move along the third direction 6. Each of the plurality of index hands 122 may be spaced apart in the vertical direction. Each of the plurality of index hands 122 may move independently.

The index rail 124 has a lengthwise direction parallel to the second direction 4. The index robot 120 is placed on the index rail 124, and the index robot 120 forwardly and backwardly moves along the index rail 124.

The controller 30 may control components included in the substrate treating apparatus 1. The controller 30 may comprise a process controller consisting of a microprocessor (computer) that executes a control of the substrate treating apparatus 1, a user interface such as a keyboard via which an operator inputs commands to manage the substrate treating apparatus 1, and a display showing the operation situation of the substrate treating apparatus 1, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

The treating module 20 may include a buffer unit 200, a transfer frame 300, and chambers 400, 500, 600, 700, and 800.

The buffer unit 200 has a buffer space. The buffer space functions as a space at which a substrate M taken into the treating module 20 and a substrate M taken out from the treating module 20 temporarily stay.

The buffer unit 200 is disposed between the index frame 14 and the transfer frame 300. The buffer unit 200 is positioned on a side of the transfer frame 300. A plurality of slots (not shown) on which the substrate M is placed are installed inside the buffer unit 200. The plurality of slots (not shown) are spaced apart from each other in the vertical direction.

The buffer unit 200 has a front face and a rear face which are open. The front face may be a surface facing the index frame 14. The rear face may be a surface facing the transfer frame 300. The index robot 120 may approach the buffer unit 200 through the front face, and the transfer robot 320 to be described later may approach the buffer unit 200 through the rear face.

The transfer frame 300 provides a space for transferring the substrate M between the buffer unit 200 and the chambers 400 to 800. The transfer frame 300 has a lengthwise direction horizontal to the first direction 2. The chambers 400 to 800 are disposed on a side of the transfer frame 300.

The transfer frame 300 and the chambers 400 to 800 are disposed in the second direction 4. According to an embodiment, the chambers 400 to 800 may be disposed on both side surfaces of the transfer frame 300. The chambers disposed on a side surface and the other side surface of the transfer frame 300 may have an arrangement of A×B (A and B are natural numbers greater than 1 or 1 respectively) along the first direction 2 and the third direction 6, respectively.

The transfer frame 300 has a transfer robot 320 and a transfer rail 324. The transfer robot 320 transfers the substrate M. More specifically, the transfer robot 320 transfers the substrate M between the buffer unit 200 and the chambers 400 to 800. In addition, the transfer robot 320 transfers the substrate M between the chambers 400 to 800. The transfer robot 320 has a plurality of hands 322 on which the substrate M is placed. The hand 322 may forwardly and backwardly move, rotate around the third direction 6 as an axis, and move along the third direction 6. The plurality of hands 322 may be disposed to be spaced apart in the vertical direction and may move independently of each other.

The transfer rail 324 is positioned in the transfer frame 300 and is formed in a direction horizontal to the lengthwise direction of the transfer frame 300. The transfer robot 320 is placed on the transfer rail 324, and the transfer robot 320 may forwardly and backwardly move along the transfer rail 324.

An object to be treated in the chambers 400 to 800 may be a substrate of any one of a wafer, a glass, and a photomask. The substrate treated in the chambers 400 to 800 according to an embodiment may be a photo mask which is a 'frame' used in an exposure process. The substrate M according to an embodiment may have a rectangular shape. A reference mark AK, a first pattern P1, and a second pattern P2 may be formed on the substrate M.

At least one reference mark AK may be formed on the substrate M. For example, the reference mark AK is a number corresponding to the number of corners of the substrate M, and may be formed in a corner region of the substrate M. The reference mark AK may be used to align the substrate M. More specifically, the reference mark AK may be used to determine whether the substrate M is twisted in a process of supporting the substrate M in a fourth support unit 720 (see FIG. 7), which will be described later. In addition, the reference mark AK may be a mark used to check position information of the substrate M. More specifically, the reference mark AK may be a mark used to check a position information on a plurality of patterns formed on the substrate M. Accordingly, the reference mark AK may be defined as a so-called align key.

At least one cell CE may be formed on the substrate M. The plurality of patterns are formed in each of the plurality of cells CE. The patterns formed in each cell CE include an exposure pattern EP and a first pattern P1. The patterns formed in each cell CE may be defined as one pattern group.

The exposure pattern EP may be used to form an actual pattern on the substrate M. The first pattern P1 may be a pattern representing the exposure patterns EP formed in one cell CE. If the plurality of cells CE are formed on the substrate M, there may also be a plurality of first patterns P1 formed on the cell CE. That is, first patterns P1 may be formed in each of a plurality of cells CE. However, the inventive concept is not limited thereto, and the plurality of first patterns P1 may be formed in one cell CE.

The first pattern P1 may have a shape in which some of the exposure patterns EP are combined. The first pattern P1 may be defined as a so-called monitoring pattern. An average value of critical dimensions of the plurality of first patterns P1 may be defined as a critical dimension monitoring macro (CDMM).

If an operator inspects the first pattern P1 formed in any one cell CE through a scanning electron microscope (SEM), whether the shape of the exposure patterns EP formed in any one cell CE are good or bad may be estimated. Accordingly, the first pattern P1 may function as an inspection pattern. Unlike the above-described example, the first pattern P1 may be any one of the exposure patterns (EP) participating in an actual exposure process. Selectively, the first pattern P1 may be an inspection pattern and may be a pattern participating in an actual exposure process at the same time.

A second pattern P2 is formed outside the cells CE formed on the substrate M. That is, the second pattern P2 is formed in an outer region of a region in which the plurality of cells CE are formed. The second pattern P2 may be a pattern representing the exposure patterns EP formed on the substrate M. The second pattern P2 may be defined as an anchor pattern. A plurality of second patterns P2 may be formed outside the cells CE. The plurality of second patterns P2 may be arranged in a combination of series and/or parallel. For example, five second patterns P2 may be formed on the substrate M, and the five second patterns P2 may be arranged in a combination of two columns and three rows.

If the operator inspects the second pattern P2 through a scanning electron microscope (SEM), it is possible to estimate whether the shape of the exposure patterns EP formed on one substrate M are good or bad. Accordingly, the second pattern P2 may function as an inspection pattern. The second pattern P2 may be an inspection pattern which does not participate in an actual exposure process. In addition, the second pattern P2 may be a pattern for setting process conditions of the exposure apparatus.

As described above, the chambers 400 to 800 are disposed on a side surface of the transfer frame 300. The chambers 400 to 800 may treat the substrate M. The chambers 400 to 800 according to an embodiment may include a first chamber 400, a second chamber 500, a third chamber 600, a fourth chamber 700, and a fifth chamber 900.

The first chamber 400 and the second chamber 500 may be disposed relatively adjacent to the buffer unit 200 than the third chamber 600, the fourth chamber 700, and the fifth chamber 900. In addition, the third chamber 600 and the fourth chamber 700 may be disposed relatively adjacent to the buffer unit 200 than the fifth chamber 900. In addition, the first chamber 400 and the second chamber 500 may be disposed to face each other with respect to the transfer frame 300. In addition, the third chamber 600 and the fourth chamber 700 may be disposed to face each other based on the transfer frame 300. However, an arrangement of the first chamber 400, the second chamber 500, the third chamber 600, the fourth chamber 700, and the fifth chamber 900 may be variously changed.

Figure 4:
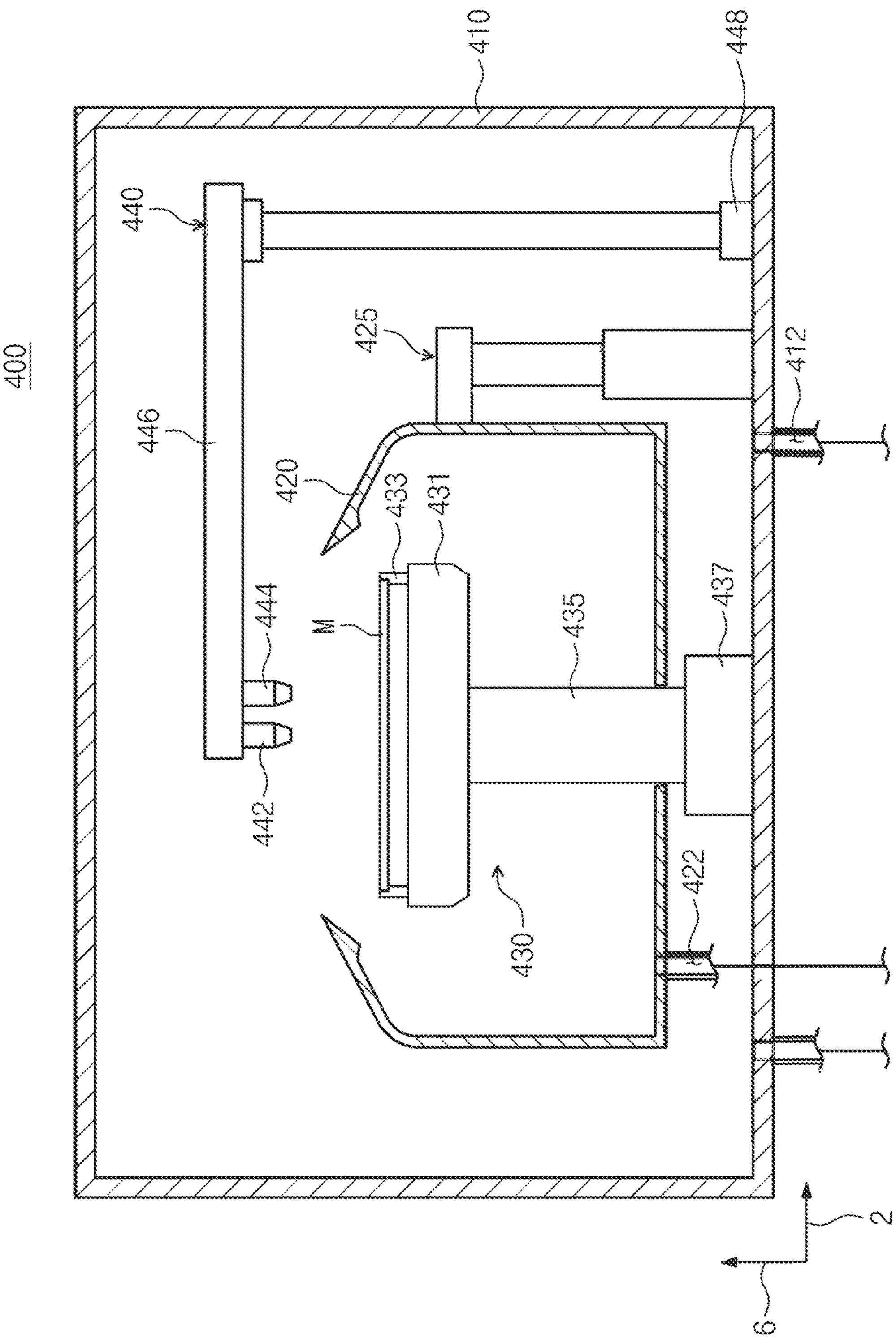
FIG. 4 is a cross-sectional view schematically illustrating a first chamber according to an embodiment.

FIG. 4 is a cross-sectional view schematically illustrating the first chamber according to an embodiment.

In the first chamber 400, the substrate M may be hydrophilized. The first chamber 400 may include a first housing 410, a first cup body 420, a first support unit 430, and a first liquid supply unit 440.

The first housing 410 may have a substantially rectangular parallelepiped shape. The first housing 410 has a space therein. The first cup body 420, the first support unit 430, and the first liquid supply unit 440 are disposed inside the first housing 410. An entrance (not shown) through which the substrate M enters and exits is formed on a sidewall of the first housing 410. In addition, a first exhaust line 412 may be connected to a bottom of the first housing 410. A pump (not shown) is installed in the first exhaust line 412 so that an inner pressure of the first housing 410 may be adjusted.

The first cup body 420 has a cup shape with an open top part. The first cup body 420 may surround an outside of a first body 431 and a first support shaft 435 to be described later. The first cup body 420 generally has a ring shape. In addition, a first recollecting line 422 is connected to a bottom of the first cup body 420. The first recollecting line 422 may recollect a liquid collected in the first cup body 420. The liquid recollected by the first recollecting line 422 may be transferred to a regeneration system not shown to be reused. In addition, the first cup body 420 is coupled to a first cup driver 425. The first cup driver 425 lifts and lowers the first cup body 420. According to an embodiment, the first cup driver 425 may be a motor.

The first support unit 430 supports and rotates the substrate M. The first support unit 430 may include a first body 431, a first support shaft 435, and a first shaft driver 437.

A top surface of the first body 431 has a substantially circular shape when viewed from above. The top surface of the first body 431 has a diameter larger than that of the substrate M. A first support pin 433 is disposed at a top end of the first body 431. The first support pin 433 upwardly protrudes from the top surface of the first body 431. For example, there may be four first support pins 433. Each of a plurality of first support pins 433 may be disposed in each corner region of the substrate M having a rectangular shape.

The first support pin 433 may have a first surface and a second surface. For example, the first surface may support a bottom end of the corner region of the substrate M, and the second surface may support a side end of the corner region of the substrate M. Accordingly, if the substrate M rotates, the second surface may restrict a separation of the substrate M toward a side.

The first support shaft 435 has a lengthwise direction parallel to the third direction 6. The first support shaft 435 may be inserted into a groove formed at a bottom of the first cup body 420. An end of the first support shaft 435 is coupled to a bottom end of the first body 431, and the other end thereof is coupled to the first shaft driver 437. The first shaft driver 437 rotates the first support shaft 435 in the third direction 6 as an axis. Accordingly, the first body 431 and the substrate M are also rotated. In addition, the first shaft driver 437 may lift and lower the first body 431 in the third direction 6.

The first liquid supply unit 440 supplies a liquid to the substrate M supported by the first support unit 430. The liquid supplied by the first liquid supply unit 440 according to an embodiment to the substrate M may include a first treating liquid and a rinsing liquid. The first treating liquid according to an embodiment may include a sulfuric peroxide mixture (SPM) liquid. More specifically, the SPM liquid may be a liquid in which an acid and a hydrogen peroxide water ($H_2O_2$) are mixed. The first treating liquid may hydrophilize a surface of a hydrophobized substrate M in a pre-treatment process. The rinsing liquid according to an embodiment may include a deionized water (DIW). In addition, the rinsing liquid according to an embodiment may be a deionized carbon dioxide water obtained by adding a carbon dioxide ($CO_2$) to the deionized water. The rinsing liquid supplied by the first liquid supply unit 440 may replace the first treating liquid supplied to the substrate M.

The first liquid supply unit 440 may include a 1-1 nozzle 442, a 1-2 nozzle 444, and a first nozzle arm 446.

The 1-1 nozzle 442 supplies the first treating liquid to the substrate M. Unlike FIG. 4, a plurality of 1-1 nozzles 442 may be provided. The plurality of 1-1 nozzles 442 may supply the first treating liquid having different composition ratios to the substrate M. However, the inventive concept is not limited thereto, and one 1-1 nozzle 442 may be provided. The 1-2 nozzle 444 supplies the rinsing liquid to the substrate M. The first nozzle arm 446 supports the 1-1 nozzle 442 and the 1-2 nozzle 444. The 1-1 nozzle 442 and the 1-2 nozzle 444 are installed at an end of the first nozzle arm 446. A position of the first nozzle arm 446 may be changed by being coupled to the first arm driver 448. Accordingly, positions of the 1-1 nozzle 442 and the 1-2 nozzle 444 may also be changed.

For example, the 1-1 nozzle 442 and the 1-2 nozzle 444 may move between a liquid supply position and a standby position. The liquid supply position may mean a position at which at least one of the 1-1 nozzle 442 and the 1-2 nozzle 444 overlaps the substrate M when viewed from above. The standby position may mean a position at which both the 1-1 nozzle 442 and the 1-2 nozzle 444 do not overlap the substrate M when viewed from above.

Figure 5:
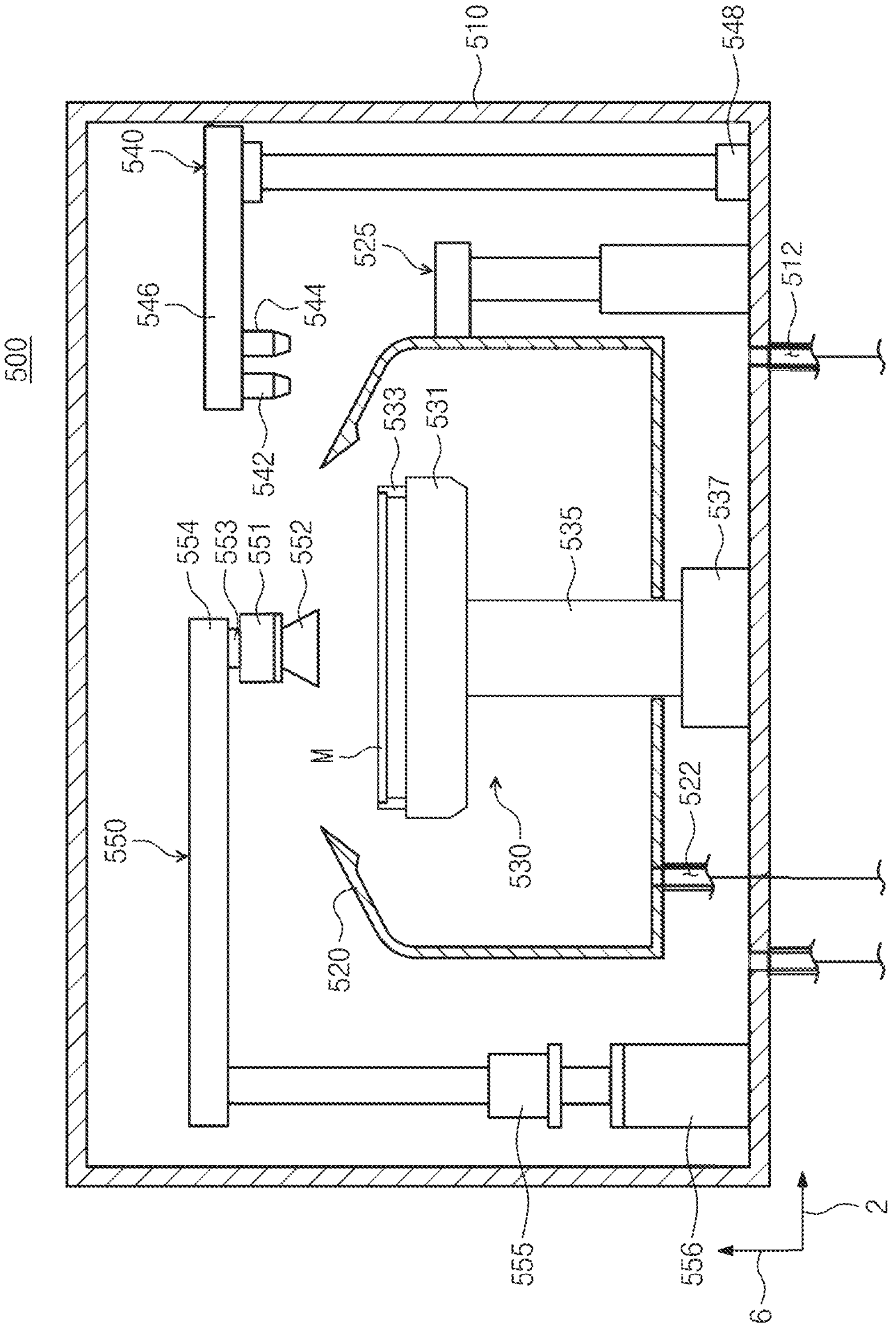
FIG. 5 is a cross-sectional view schematically illustrating a second chamber according to an embodiment.

FIG. 5 is a cross-sectional view schematically illustrating the second chamber according to an embodiment.

In the second chamber 500, a residue remaining on the substrate M may be removed. For example, in the second chamber 500, an organic matter remaining on the substrate M may be removed. The second chamber 500 may include a second housing 510, a second cup body 520, a second support unit 530, a second liquid supply unit 540, and a first ultrasonic application unit 550.

A configuration included in the second housing 510, a second exhaust line 512 installed at a bottom of the second housing 510, the second cup body 520, and the second support unit 530 and a structure of each of the configurations are similar to those of the first housing 410, the first exhaust line 412, the first cup body 420, and the first support unit 430 described with reference to FIG. 4. Therefore repeated descriptions will be omitted.

The second liquid supply unit 540 supplies a liquid to the substrate M supported by the second support unit 530. The liquid supplied by the second liquid supply unit 540 according to an embodiment to the substrate M may include a second treating liquid and a rinsing liquid. The second treating liquid according to an embodiment may include a SC-1 (Standard Clean 1) liquid. More specifically, the SC-1 liquid may be a mixed liquid of an ammonium hydroxide ($NH_4OH$), a hydrogen peroxide ($H_2O_2$), and a deionized water (DIW). The second treating liquid may remove residues, particularly the organic materials, remaining on the substrate M. According to an embodiment, the rinsing liquid may be a deionized water (DIW) or a deionized carbon dioxide water. The rinsing liquid supplied by the second liquid supply unit 540 may replace the second treating liquid supplied to the substrate M.

The second liquid supply unit 540 may include a 2-1 nozzle 542 and a 2-2 nozzle 544. The 2-1 nozzle 542 supplies a second treating liquid to the substrate M. At least one of the 2-1 nozzles 542 may be provided. If a plurality of 2-1 nozzles 542 are provided, each of the 2-1 nozzles 542 may supply the second treating liquid having different composition ratios to the substrate M. The 2-2 nozzle 544 supplies a rinsing liquid to the substrate M. The 2-1 nozzle 542 and the 2-2 nozzle 544 are installed at an end of the second nozzle arm 546. The second nozzle arm 546 is coupled to the second arm driver 548 and its position is changed. The 2-1 nozzle 542 and the 2-2 nozzle 544 may move between the standby position and the liquid supply position by the second arm driver 548.

The standby position may mean a position at which both the 2-1 nozzle 542 and the 2-2 nozzle 544 do not overlap the substrate M supported on the second support unit 530 if viewed from above. In addition, the liquid supply position may mean a position at which at least one of the 2-1 nozzle 542 and 2-2 nozzle 544 overlaps the substrate M supported by the second support unit 530.

The first ultrasonic application unit 550 is disposed inside the second housing 510. The first ultrasonic application unit 550 is disposed at a position which does not interfere with the second liquid supply unit 540. The first ultrasonic application unit 550 applies ultrasonic waves to a liquid remaining on the substrate M. More specifically, the first ultrasonic application unit 550 may apply a vibration energy to the second treating liquid remaining on the substrate M.

The first ultrasonic application unit 550 according to an embodiment may include a first cover 551, a first ultrasonic nozzle 552, a first cover arm 554, and first drivers 555 and 556.

The first cover 551 may have a substantially cylindrical shape. A first transducer (not shown) for converting an electrical energy into a vibration energy may be disposed inside the first cover 551. The first transducer (not shown) according to an embodiment may be a piezoelectric transducer. The electrical energy applied to the first transducer (not shown) may be supplied from an outer source. The first transducer (not shown) and the outer source may be electrically connected to each other through an electric wire (not shown) disposed inside a first cover rod 553 and a first cover arm 554 to be described later. The outer source may change a magnitude of the electrical energy applied to the first transducer (not shown). Accordingly, the magnitude of the vibration energy (frequency) converted by the first transducer (not shown) may be changed.

The first ultrasonic nozzle 552 is coupled to a bottom end of the first cover 551. When viewed from above, the first ultrasonic nozzle 552 may have a substantially circular shape. The first ultrasonic nozzle 552 may have a shape in which a diameter increases from a top end thereof to a bottom end thereof. However, the inventive concept is not limited to the above-described example, and shapes of the first cover 551 and the first ultrasonic nozzle 552 may be variously changed.

The vibration energy converted from the first transducer (not shown) is transmitted to the first ultrasonic nozzle 552. Since a cross-sectional area of the first ultrasonic nozzle 552 gradually increases from the top end to the bottom end, the vibration energy applied to the substrate M is widely dispersed.

The cover rod 553 is coupled to a top end of the first cover 551. A first cover rod 553 may have a vertical lengthwise direction. The first cover 551 is coupled to the first cover arm 554 via the cover rod 553. The first cover arm 554 is coupled to a first rotary driver 555. In addition, the first cover arm 554 is coupled to a first vertical driver 556.

The first rotary driver 555 changes a position of the first cover arm 554 in a direction horizontal to the ground. More specifically, the first rotary driver 555 rotates the first cover arm 554 with a direction perpendicular to the ground as a rotation axis. In addition, the first vertical driver 556 changes the position of the first cover arm 554 in a direction perpendicular to the ground. Accordingly, the first ultrasonic nozzle 552 may move in a vertical direction or a horizontal direction.

For example, the first ultrasonic nozzle 552 may move between an ultrasonic application position and a standby position. The ultrasonic application position may be a position at which the first ultrasonic nozzle 552 overlaps the substrate M supported by the second support unit 530 when viewed from above. The standby position may be a position at which the first ultrasonic nozzle 552 does not overlap the substrate M when viewed from above.

Figure 6:
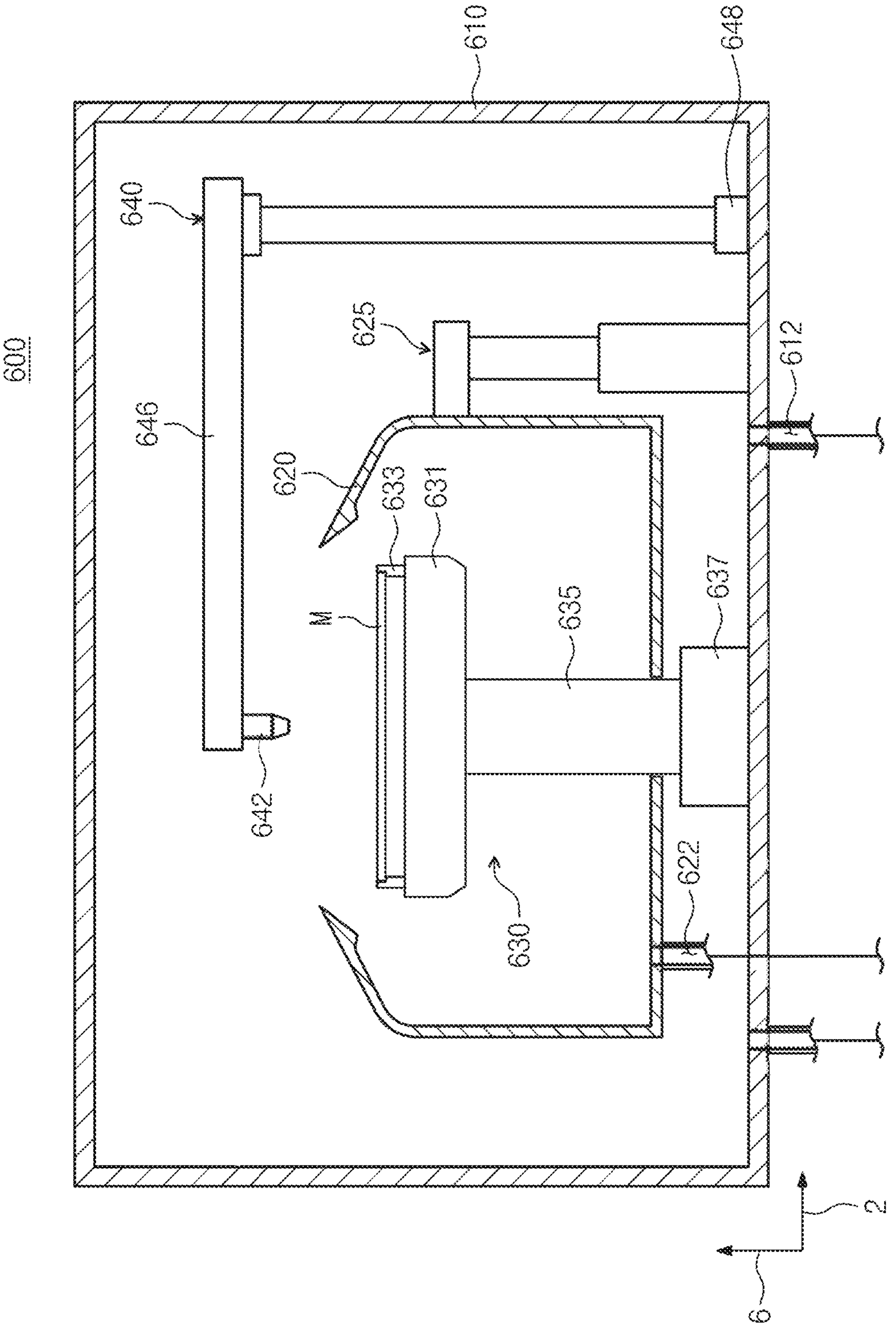
FIG. 6 is a cross-sectional view schematically illustrating a third chamber according to an embodiment.

FIG. 6 is a cross-sectional view schematically illustrating the third chamber according to an embodiment.

The third chamber 600 may dry the substrate M. More specifically, the third chamber 600 may dry the substrate M by removing a liquid remaining on the substrate M. The third chamber 600 may include a third housing 610, a third cup body 620, a third support unit 630, and a third liquid supply unit 640.

The structures of the third housing 610, a third exhaust line 612 installed on a bottom of the third housing 610, the third cup body 620, and the third support unit 630 are similar to those of the first housing 410, the first exhaust line 412, and the first support unit 430 described with reference to FIG. 4. Therefore repeated descriptions will be omitted.

The third liquid supply unit 640 may include a 3-1 nozzle 642, a third nozzle arm 646, and a third arm driver 648.

The 3-1 nozzle 642 supplies a liquid to the substrate M. More specifically, the 3-1 nozzle 642 supplies an organic solvent to the substrate M supported by the third support unit 630. The organic solvent according to an embodiment may include an isopropyl alcohol (IPA). The organic solvent supplied to the substrate M may dry the substrate M.

The 3-1 nozzle 642 is installed at an end of the third nozzle arm 646. The third nozzle arm 646 is coupled to the third arm driver 648. The third arm driver 648 changes a position of the third nozzle arm 646, and accordingly, a position of the 3-1 nozzle 642 is also changed. For example, the 3-1 nozzle 642 may move between a standby position and a liquid supply position.

The standby position may mean a position at which the 3-1 nozzle 642 does not overlap the substrate M supported by the third support unit 630 when viewed from above. In addition, the liquid supply position may mean a position at which the 3-1 nozzle 642 overlaps the substrate M supported by the third support unit 630 when viewed from above.

Figure 7:
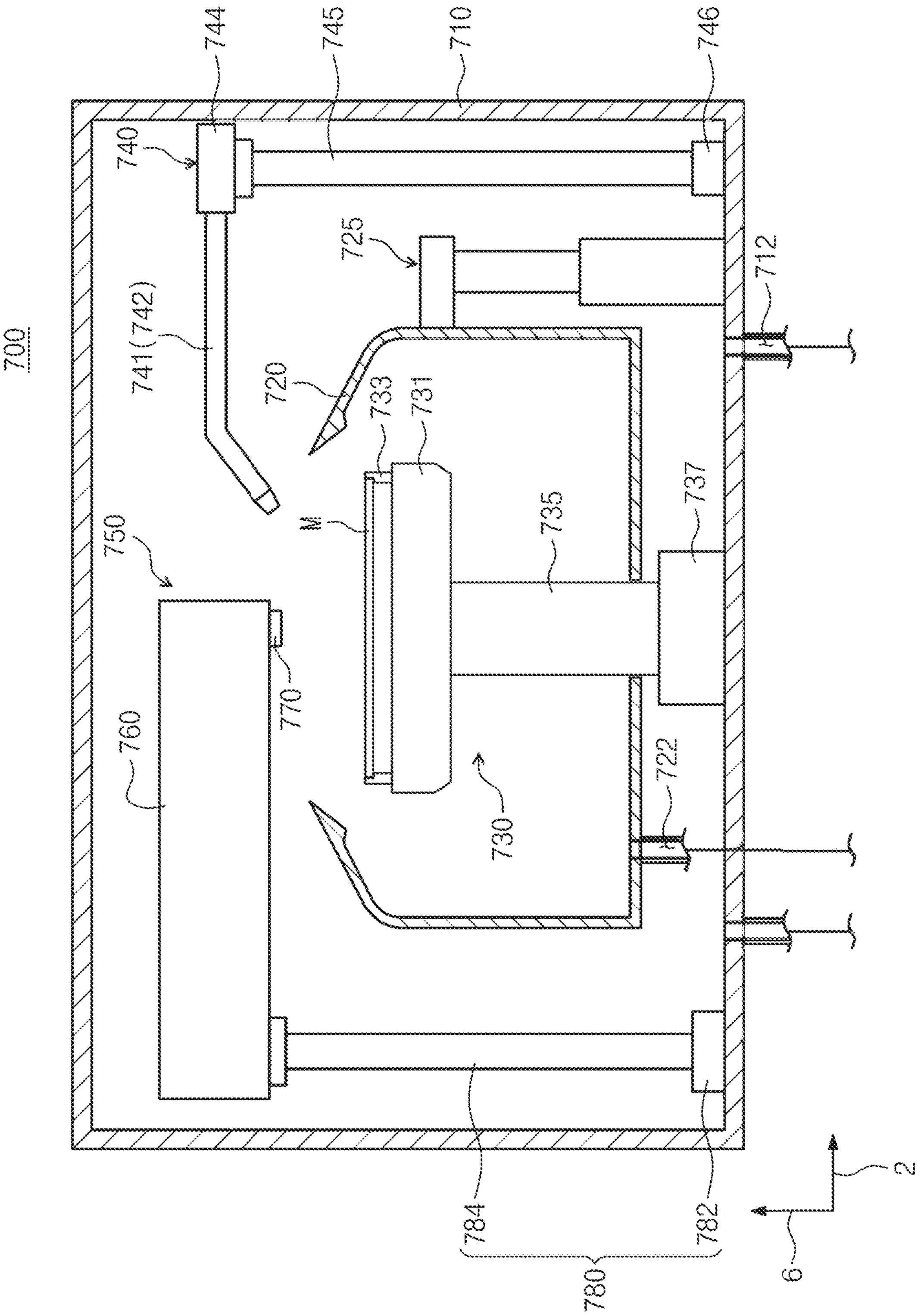
FIG. 7 is a cross-sectional view schematically illustrating a fourth chamber according to an embodiment.
Figure 8:
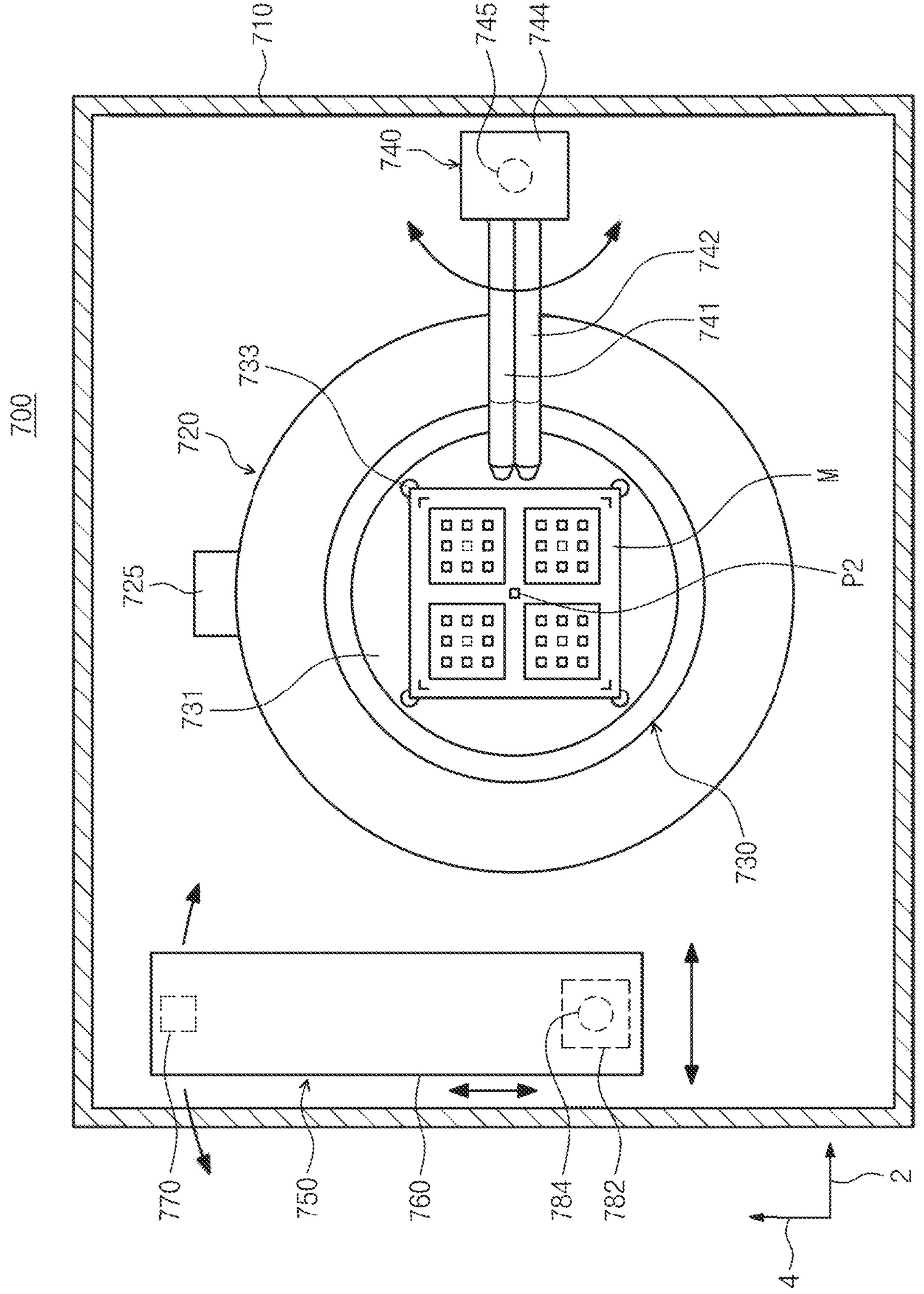
FIG. 8 illustrates the fourth chamber viewed from above according to an embodiment.
Figure 9:
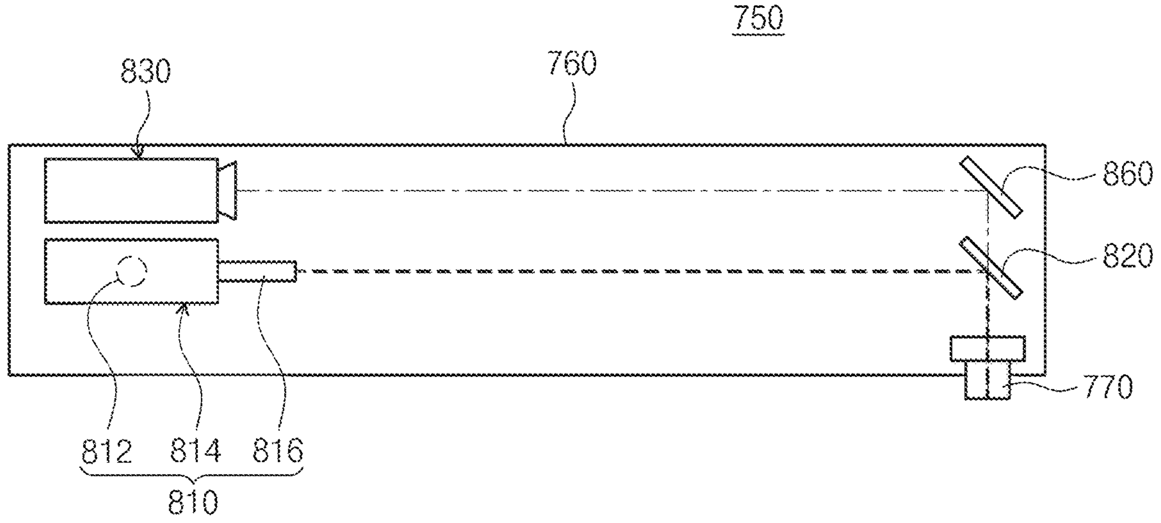
FIG. 9 is a cross-sectional view of an optical module according to an embodiment as viewed from a side.
Figure 10:
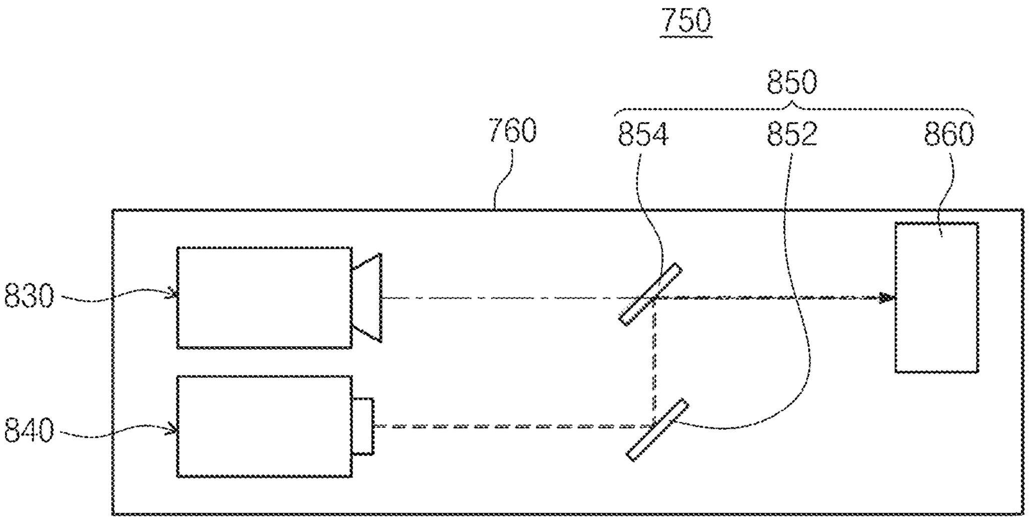
FIG. 10 is a cross-sectional view of an optical module according to an embodiment as viewed from above.

FIG. 7 is a cross-sectional view schematically illustrating the fourth chamber according to an embodiment. FIG. 8 illustrates the fourth chamber viewed from above according to an embodiment. FIG. 9 is a cross-sectional view of an optical module according to an embodiment as viewed from a side. FIG. 10 is a cross-sectional view of the optical module according to an embodiment as viewed from above.

In the fourth chamber 700, the substrate M may be etched. More specifically, in the fourth chamber 700, a specific pattern among a plurality of patterns formed on the substrate M may be etched.

The fourth chamber 700 may include a fourth housing 710, a fourth cup body 720, a fourth support unit 730, a fourth liquid supply unit 740, and an optical module 750.

The fourth housing 710 may have a substantially hexahedral shape. The fourth housing 710 has a space therein. The fourth cup body 720, the fourth support unit 730, the fourth liquid supply unit 740, and the optical module 750 are disposed inside the fourth housing 710.

An entrance (not shown) through which the substrate M enters and exits is formed on a sidewall of the fourth housing 710. The entrance (not shown) is selectively opened and closed by a door assembly which is not shown. An inner wall surface of the fourth housing 710 may be coated with a material having a high corrosion resistance with respect to an etchant to be described later. A fourth exhaust line 712 is connected to a bottom of the fourth housing 710. A pump (not shown) is installed in the fourth exhaust line 712 to adjust the inner pressure of the fourth housing 710.

The fourth cup body 720 has a cylindrical shape with an open top part. The fourth cup body 720 generally has a ring shape. The fourth cup body 720 is disposed to surround a fourth body 731 and a fourth support shaft 735 to be described later. The top part of the fourth cup body 720 may be upwardly inclined from a bottom to a top. An inside of the fourth cup body 720 functions as a space for a liquid treatment and/or a heat treatment on the substrate M. The fourth cup body 720 prevents the liquid supplied to the substrate M from being scattered to the inner wall surface of the fourth housing 710, the fourth liquid supply unit 740, and the optical module 750.

An opening may be formed at a center of a bottom of the fourth cup body 720. The fourth support shaft 735 to be described later may be inserted into an opening formed in the fourth cup body 720. In addition, a fourth recollecting line 722 is connected to the bottom of the fourth cup body 720. The liquid supplied by the fourth liquid supply unit 740 is recollected to an outer regeneration system (not shown) through the fourth recollecting line 722. In addition, the fourth cup body 720 is coupled to a fourth cup driver 725. The fourth cup driver 725 moves the fourth cup body 720 in the vertical direction.

The fourth support unit 730 supports and rotates the substrate M. The fourth support unit 730 may include the fourth body 731, the fourth support pin 733, the fourth support shaft 735, and the fourth shaft driver 737. Since structures of the fourth body 731, the fourth support pin 733, the fourth support shaft 735, and the fourth shaft driver 737 are mostly or similar to those of the first body 431, the first support pin 433, and the first support shaft 435 described with reference to FIG. 4, repeated descriptions will be omitted.

The fourth liquid supply unit 740 supplies a liquid to the substrate M. The liquid supplied by the fourth liquid supply unit 740 to the substrate M supported by the fourth support unit 730 may include an etchant and a rinsing liquid. The etchant may be an etchant which etches patterns formed on the substrate M. For example, the etchant may be a liquid including a mixed liquid in which an ammonia, a water, and additives are mixed and a liquid containing a hydrogen peroxide. In addition, the rinsing liquid may be a deionized water or a deionized carbon dioxide water.

The fourth liquid supply unit 740 may include a 4-1 nozzle 741 and a 4-2 nozzle 742. The 4-1 nozzle 741 supplies an etchant to the substrate M supported by the fourth support unit 730. The 4-2 nozzle 742 supplies a rinsing liquid to the substrate M supported by the fourth support unit 730. Accordingly, the 4-1 nozzle 741 may be referred to as a treating liquid supply unit, and the 4-2 nozzle 742 may be referred to as a rinsing liquid supply unit.

An end of the 4-1 nozzle 741 and the 4-2 nozzle 742 are coupled to a fixing body 744, respectively, and the other ends thereof extend away from the fixing body 744. According to an embodiment, the other ends of the 4-1 nozzle 741 and the 4-2 nozzle 742 may extend inclined at a predetermined angle in a direction toward the substrate M supported by the fourth support unit 730. Unlike FIG. 8, a plurality of fourth-1 nozzles 741 may be provided. If the plurality of 4-1 nozzles 741 are provided, the etchant supplied from each of the 4-1 nozzles 741 to the substrate M may have different composition ratios.

The fixing body 744 is coupled to a rotation shaft 745 having a lengthwise direction parallel to the third direction 6. An end of the rotation shaft 745 is coupled to the fixing body 744, and the other end thereof is coupled to the rotary driver 746. The rotary driver 746 rotates the rotation shaft 745 about the third direction 6 as the axis. Accordingly, the 4-1 nozzle 741 and the 4-2 nozzle 742 may also rotate on a horizontal plane.

According to an embodiment, the 4-1 nozzle 741 and the 4-2 nozzle 742 move between a liquid supply position and a standby position. For example, the liquid supply position may mean a position at which at least one of the 4-1 nozzle 741 and the 4-2 nozzle 742 overlaps the substrate M when viewed from above. In addition, the standby position may mean a position at which both the 4-1 nozzle 741 and the 4-2 nozzle 742 do not overlap the substrate M when viewed from above. A home port (not shown) in which the 4-1 nozzle 741 and the 4-2nd nozzle 742 stands-by may be disposed at the standby position.

The optical module 750 heats the substrate M. More specifically, the optical module 750 heats a specific region of the substrate M. A detailed mechanism for this will be described later.

The optical module 750 may include an optical cover 760, a head nozzle 770, a moving unit 780, a laser unit 810, an imaging unit 830, and a lighting unit 840.

The optical cover 760 has an installation space therein. The installation space of the optical cover 760 has an environment sealed from the outside. Inside the optical cover 760, a portion of the head nozzle 770, the laser unit 810, the imaging unit 830, and the lighting unit 840 are disposed. The head nozzle 770, the laser unit 810, the imaging unit 830, and the lighting unit 840 are modularized by the optical cover 760.

An opening is formed in a bottom portion of the optical cover 760. A portion of the head nozzle 770 to be described later is inserted into the opening formed in the optical cover 760. Accordingly, the head nozzle 770 may be positioned such that a portion thereof downwardly protrudes from a bottom end of the optical cover 760. The head nozzle 770 may be formed of an objective lens and a barrel. The laser unit 810 to be described later may irradiate a laser to the substrate M through the head nozzle 770. In addition, the imaging unit 830 described later may acquire an image of the substrate M through the head nozzle 770.

The moving unit 780 is coupled to the optical cover 760. The moving unit 780 moves the optical cover 760. The moving unit 780 may include a shaft driver 782 and a shaft 784. An end of the shaft 784 may be coupled to the bottom end of the optical cover 760, and the other end of the shaft 784 may be connected to the shaft driver 782. The shaft 784 has a lengthwise direction parallel to the third direction 6. The shaft driver 782 may be a motor. The shaft driver 782 may rotate the shaft 784 with an axial direction in the third direction 6. In addition, the shaft driver 782 may be composed of a plurality of motors. For example, one of the plurality of motors may rotate the shaft 784, the other may lift and lower the shaft 784 in the third direction 6, and the other may be mounted on a guide rail not shown to forwardly and backwardly move in the first direction 2 or the second direction 4. By the above-described shaft driver 782, a position of the optical cover 760 is changed, and a position of the head nozzle 770 is also changed.

Accordingly, the optical module 750 may move between a standby position and a process position. For example, the standby position may be a position at which the head nozzle 770 does not overlap the substrate M supported by the fourth support unit 730 when viewed from above. If the head nozzle 770 is positioned at a standby position, a standby port (not shown) may be positioned at a bottom side of the head nozzle 770. In the standby port (not shown), a maintenance operation for adjusting or checking a state of the optical module 750 may be performed. In addition, the process position may be a position at which the head nozzle 770 overlaps the substrate M supported by the fourth support unit 730. More specifically, the process position may be a position at which the head nozzle 770 overlaps the second pattern P2 formed on the substrate M.

The laser unit 810 irradiates the substrate M with a laser. The laser unit 810 irradiates a specific region area of the substrate M with the laser to heat the specific region. The specific region according to an embodiment may be a second pattern P2.

The laser unit 810 includes an oscillation unit 812 and an expander 816. The oscillation unit 812 oscillates a laser. The oscillation unit 812 oscillates the laser toward the expander 816. An output of the laser oscillated from the oscillation unit 812 may be adjusted according to process requirements. In addition, a tilting member 814 is installed in the oscillation unit 812. The tilting member 814 may change an oscillation direction of the laser oscillated from the oscillation unit 812 by adjusting an angle at which the oscillation unit 812 is disposed.

The expander 816 may include a plurality of lenses not shown. The expander 816 adjusts an interval between the plurality of lenses to change a divergence angle of the laser oscillated from the oscillation unit 812. Accordingly, the expander 816 may adjust a profile of the laser by expanding or reducing a diameter of the laser. The expander 816 according to an embodiment may be a variable expander telescope (BET). The laser adjusted to a predetermined profile in the expander 816 is transmitted to a bottom reflective plate 820.

The bottom reflective plate 820 is positioned on a moving path of the laser oscillated from the oscillation unit 812. In addition, the bottom reflective plate 820 is positioned to overlap the head nozzle 770 when viewed from above. The bottom reflective plate 820 may be tilted at a predetermined angle such that the laser oscillated from the oscillation unit 812 is transmitted to the head nozzle 770. Accordingly, the laser oscillated from the oscillation unit 812 is irradiated to the second pattern P2 through the expander 816, the bottom reflective plate 820, and the head nozzle 770.

The imaging unit 830 images the substrate M to obtain an image of the substrate M. The image according to an embodiment may be a picture or a video. The imaging unit 830 may be a camera module. According to an embodiment, the imaging unit 830 may be a camera module which focus is automatically adjusted. The lighting unit 840 provides a lighting to the substrate M so that the imaging unit 830 may more easily acquire an image of the substrate M.

The top reflective unit 850 may include a first reflective plate 852, a second reflective plate 854, and an top reflective plate 860.

The first reflective plate 852 and the second reflective plate 854 are installed at heights corresponding to each other. The first reflective plate 852 changes a direction of the lighting provided by the lighting unit 840. For example, the first reflective plate 852 reflects a lighting in a direction toward the second reflective plate 854. The second reflective plate 854 reflects a lighting again to the top reflective plate 860.

The top reflective plate 860 is disposed to overlap the bottom reflective plate 820 when viewed from above. In addition, the top reflective plate 860 is disposed above the bottom reflective plate 820. In addition, the top reflective plate 860 may be tilted at the same angle as the bottom reflective plate 820. Accordingly, the imaging unit 830 may acquire an image of the substrate M via the top reflective plate 860 and the head nozzle 770. In addition, the lighting unit 840 may provide a lighting to the substrate M through the first reflective plate 852, the second reflective plate 854, the top reflective plate 860, and the head nozzle 770. That is, an irradiation direction of the laser irradiated to the substrate M, an imaging direction of imaging the substrate M, and the lighting direction provided to the substrate M may have coaxial axes.

Unlike the above-described example, the fourth liquid supply unit 740 may have a structure similar to that of the first liquid supply unit 440 shown in FIG. 4. For example, the 4-1 nozzle 741 and the 4-2 nozzle 742 are coupled to the bottom end of the nozzle arm, and a position of the nozzle arm may be changed by the arm driver.

Figure 11:
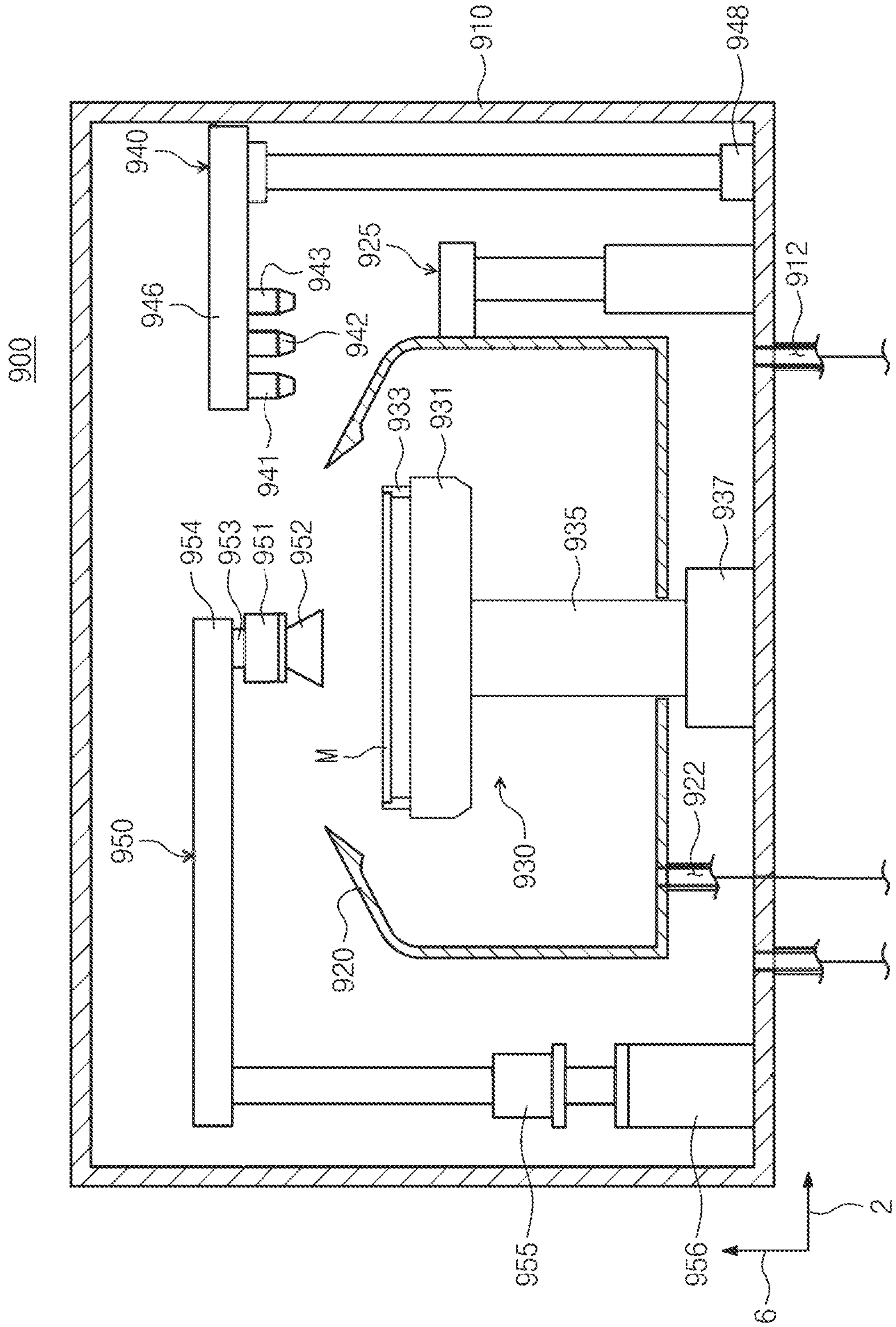
FIG. 11 is a cross-sectional view schematically illustrating a fifth chamber according to an embodiment.

FIG. 11 is a cross-sectional view schematically illustrating the fifth chamber according to an embodiment.

In the fifth chamber 900, a treatment residue generated in a process of treating the substrate M in the fourth chamber 700 may be removed. The fifth chamber 900 may include a fifth housing 910, a fifth cup body 920, a fifth support unit 930, a fifth liquid supply unit 940, and a second ultrasonic application unit 950.

Since structures of the fifth housing 910, a fifth exhaust line 912, the fifth cup body 920, and fifth support unit 930 are mostly the same as or similar to those of the first housing 410, the first exhaust line 412, the first cup body 420, and the first support unit 430 described with reference to FIG. 4, repeated descriptions will be omitted. Also, a structure of the second ultrasonic application unit 950 and each component is mostly the same or similar to a structure of the first ultrasonic application unit 550 described with reference to FIG. 5, so repeated descriptions will be omitted.

The fifth liquid supply unit 940 may include a 5-1 nozzle 941, a 5-2 nozzle 942, a 5-3 nozzle 943, a fifth nozzle arm 946, and a fifth arm driver 948.

The 5-1 nozzle 941 supplies the second treating liquid to the substrate M. The second treating liquid supplied by the 5-1 nozzle 941 to the substrate M is the same as the second treating liquid supplied by the 2-1 nozzle 542 described above. That is, the 5-1 nozzle 941 may supply the SC-1 liquid to the substrate M. In addition, the 5-2 nozzle 942 supplies a rinsing liquid to the substrate M. The rinsing liquid supplied by the 5-2 nozzle 942 may include a deionized water or a deionized carbon dioxide water. The 5-3 nozzle 943 may supply an organic solvent to the substrate M. The organic solvent supplied by the 5-3 nozzle 943 may include an IPA.

The 5-1 nozzle 941, the 5-2 nozzle 942, and the 5-3 nozzle 943 are coupled to an end of the fifth nozzle arm 946, respectively. The fifth nozzle arm 946 is coupled to the fifth arm driver 948, and its position is changed. Accordingly, positions of the 5-1 nozzle 941, the 5-2 nozzle 942, and the 5-3 nozzle 943 are also changed. The 5-1 nozzle 941, the 5-2 nozzle 942, and the 5-3 nozzle 943 move between a liquid supply position and a standby position. For example, the liquid supply position may mean a position at which at least one of the 5-1 nozzle 941, the 5-2 nozzle 942, and the 5-3 nozzle 943 overlaps the substrate M when viewed from above. In addition, the standby position may mean a position at which all of the 5-1 nozzles 941, 5-2 nozzles 942, and 5-3 nozzles 943 do not overlap the substrate M when viewed from above.

Hereinafter, a substrate treating method according to an embodiment of the inventive concept will be described. The substrate treating method described below may be performed by the substrate treatment apparatus 1 described with reference to FIG. 1 to FIG. 11. Accordingly, hereinafter, the substrate treating method according to an embodiment will be described by citing reference codes shown in FIG. 1 to FIG. 11. In addition, the substrate treating method described below can be performed by controlling the configurations of the substrate treating apparatus 1 by the controller 30 described above.

Figure 12:
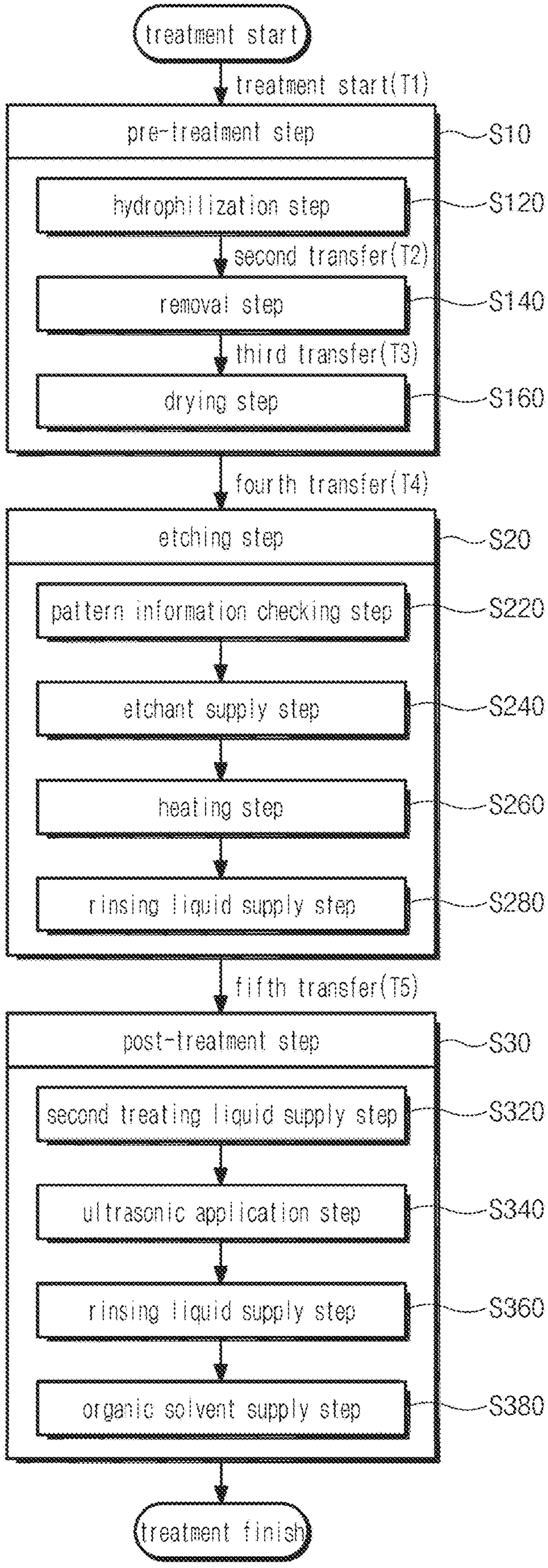
FIG. 12 is a flowchart of a substrate treating method according to an embodiment.
Figure 13:
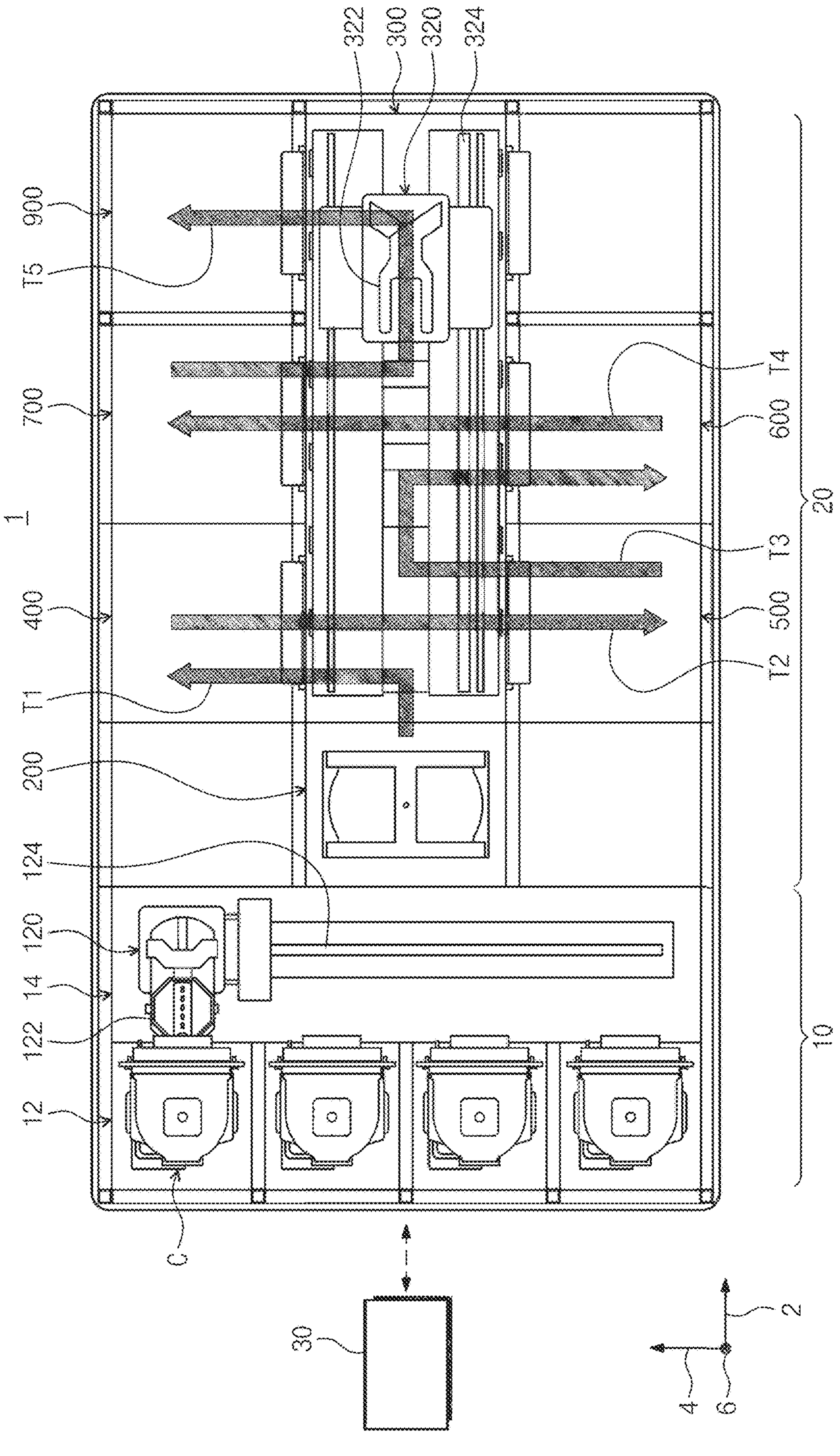
FIG. 13 is a plan view schematically illustrating a process of transferring the substrate in the substrate treating apparatus according to an embodiment.

FIG. 12 is a flowchart of the substrate treating method according to an embodiment. FIG. 13 is a plan view schematically illustrating a process of transferring the substrate in the substrate treating apparatus according to an embodiment. FIG. 14 to FIG. 26 are illustrate a state in which the substrate is treated by the substrate treating method according to an embodiment in order of time series.

The substrate treating method according to an embodiment may include a pre-treatment step S10, an etching step S20, and a post-treatment step S30. The pre-treatment step S10, the etching step S20, and the post-treatment step S30 may be sequentially performed.

In the pre-treatment step S10, the substrate M is cleaned. In the pre-treatment step S10, the substrate M is preemptively cleaned so that an etching on a specific region of the substrate M can be smoothly performed in the etching step S20 to be described later. The pre-treatment step S10 may include a hydrophilization step S120, a removal step S140, and a drying step S160. The hydrophilization step S120, the removal step S140, and the drying step S160 may be sequentially performed.

In order to perform the hydrophilization step S120, the transfer robot 320 transfers the substrate M stored in the buffer unit 200 to the first chamber 400 (T1, first transfer). The substrate M stored in the buffer unit 200 may be a substrate M on which a predetermined treatment has been performed. A surface of the substrate M on which the predetermined treatment has been performed may be in a hydrophobic state. If the substrate M is transferred to the first chamber 400 and the substrate M is supported by the first support unit 430, the hydrophilization step S120 is performed.

Figure 14:
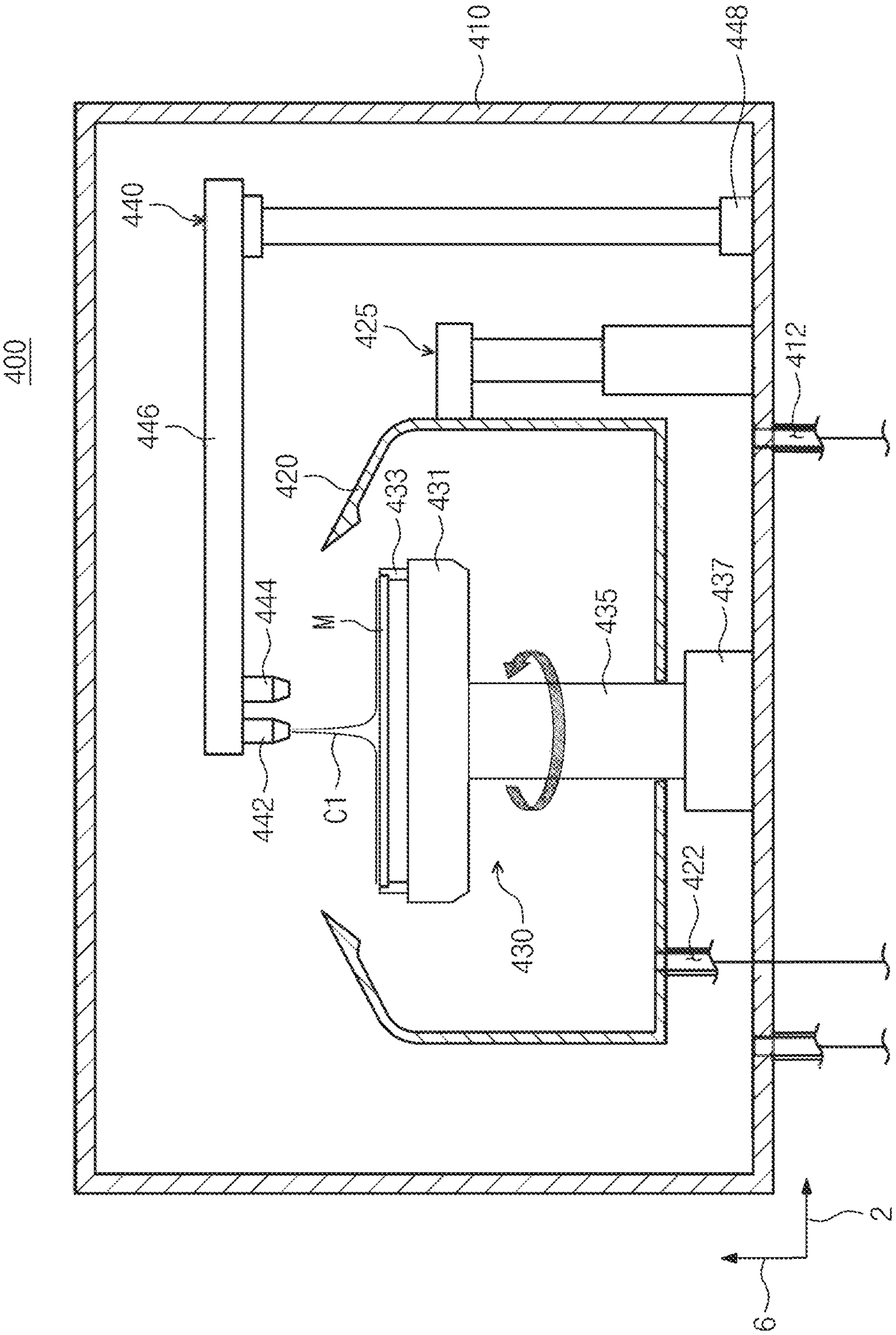
FIG. 14 and FIG. 15 schematically illustrates the first chamber performing a hydrophilization step according to an embodiment.

As shown in FIG. 14, in the hydrophilization step S120, the 1-1 nozzle 442 moves from the standby position to the liquid supply position. If the 1-1 nozzle 442 is completely moved to the liquid supply position, the 1-1 nozzle 442 is supported by the first support unit 430 and supplies the first treating liquid C1 to the rotating substrate M. The first treating liquid C1 may be supplied to an entire region of the top surface of the substrate M by a centrifugal force of the rotating substrate M. As described above, the first treating liquid according to an embodiment may include an SPM liquid. The first treating liquid C1 supplied to the substrate M hydrophilizes a surface of the hydrophobized substrate M and improves a reactivity between the substrate M and the liquid in a subsequent treatment step.

Figure 15:
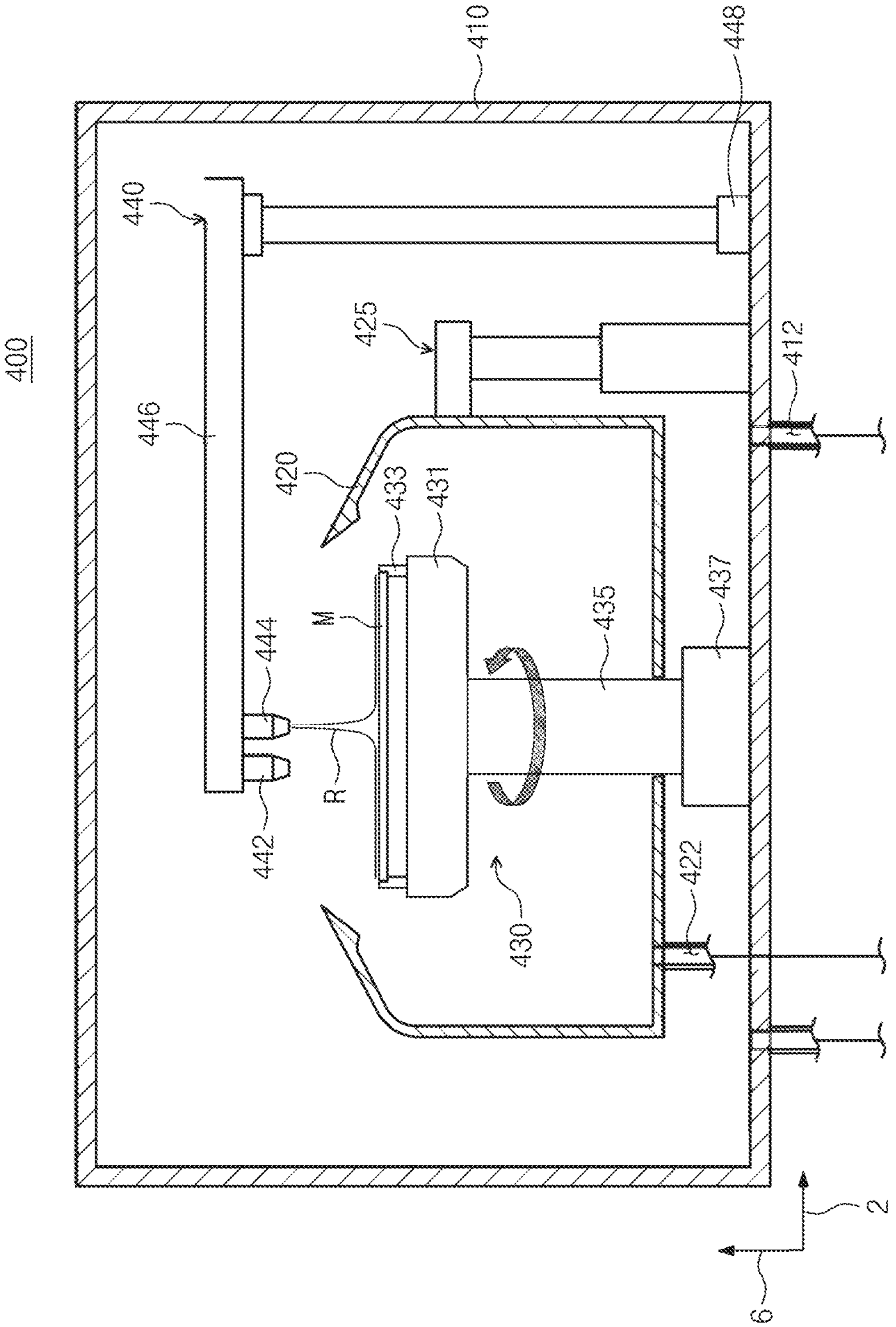

As illustrated in FIG. 15, the first treating liquid C1 is uniformly supplied to the entire region of the substrate M, and then the rinsing liquid R is supplied to the substrate M. The 1-2 nozzle 444 supplies the rinsing liquid R to the substrate M rotating at the liquid supply position. The rinsing liquid according to an embodiment may be a deionized water or a deionized carbon dioxide water. The rinsing liquid R cleans the substrate M by replacing the first treating liquid previously supplied to the substrate M. If the rinsing liquid R is supplied to the substrate M in an amount satisfying the process condition, the 1-2 nozzle 444 stops supplying the rinsing liquid R, and the first support unit 430 stops rotating the substrate M.

The transfer robot 320 transfers the substrate M from the first chamber 400 to the second chamber 500 (T2, second transfer) to perform the removal step S140. More specifically, the substrate M on which the hydrophilization step S120 is completed is transferred from the first chamber 400 to the second chamber 500 in a state in which the rinsing liquid is wetted on the top surface thereof. According to an embodiment, since the rinsing liquid is transferred to a separate chamber in a wetted state, it is possible to minimize a collapse of patterns formed on the substrate M, unlike a substrate in a dry state.

If the substrate M wetted with the rinsing liquid is transferred to the second chamber 500 and the substrate M is supported by the second support unit 530, the removal step S140 is performed. In the removal step S140, the treatment residue (organic matter) remaining on the substrate M may be removed. More specifically, in the removal step S140, the treatment residue generated in a process of performing the hydrophilizing step S120 may be removed from the substrate M.

Figure 16:
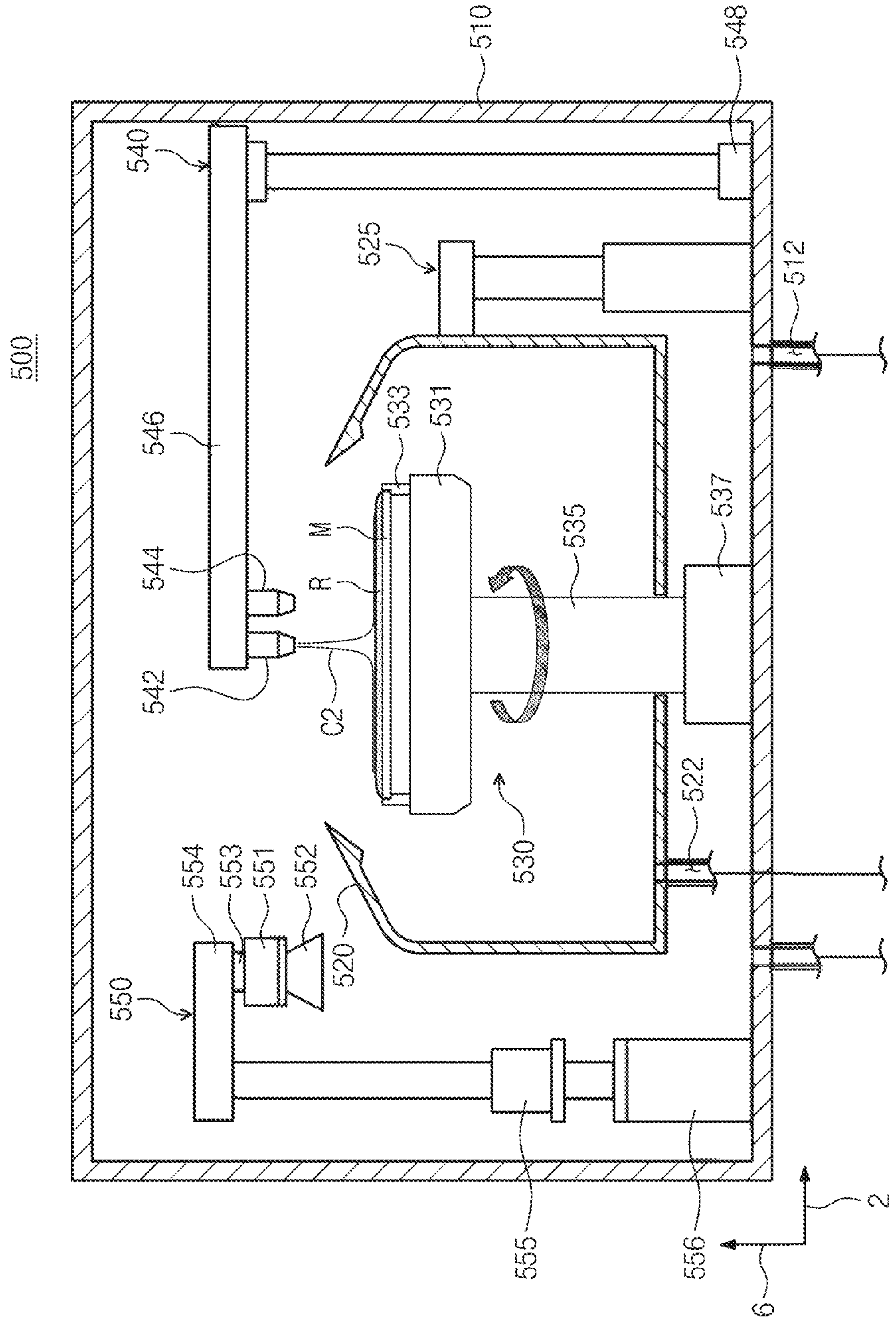
FIG. 16 to FIG. 18 schematically illustrate the second chamber performing a removal step according to an embodiment.

As shown in FIG. 16, if the substrate M is supported by the second support unit 530, the 2-1 nozzle 542 moves from the standby position to the liquid supply position. The substrate M in a state in which the rinsing liquid R is wetted may be supported on the second support unit 530. If the 2-1 nozzle 542 is positioned at the liquid supply position, the 2-1 nozzle 542 supplies the second treating liquid C2 to the rotating substrate M. As described above, the second treating liquid C2 may include an SC-1 liquid. The second treating liquid C2 supplied to the substrate M may remove the treatment residue remaining on the substrate M from the substrate M. In particular, the second treating liquid C2 may efficiently remove an organic matter remaining in the substrate M from the substrate M. The 2-1 nozzle 542 stops supplying the second treating liquid C2 to the substrate M and moves from the liquid supply position to the standby position.

Figure 17:
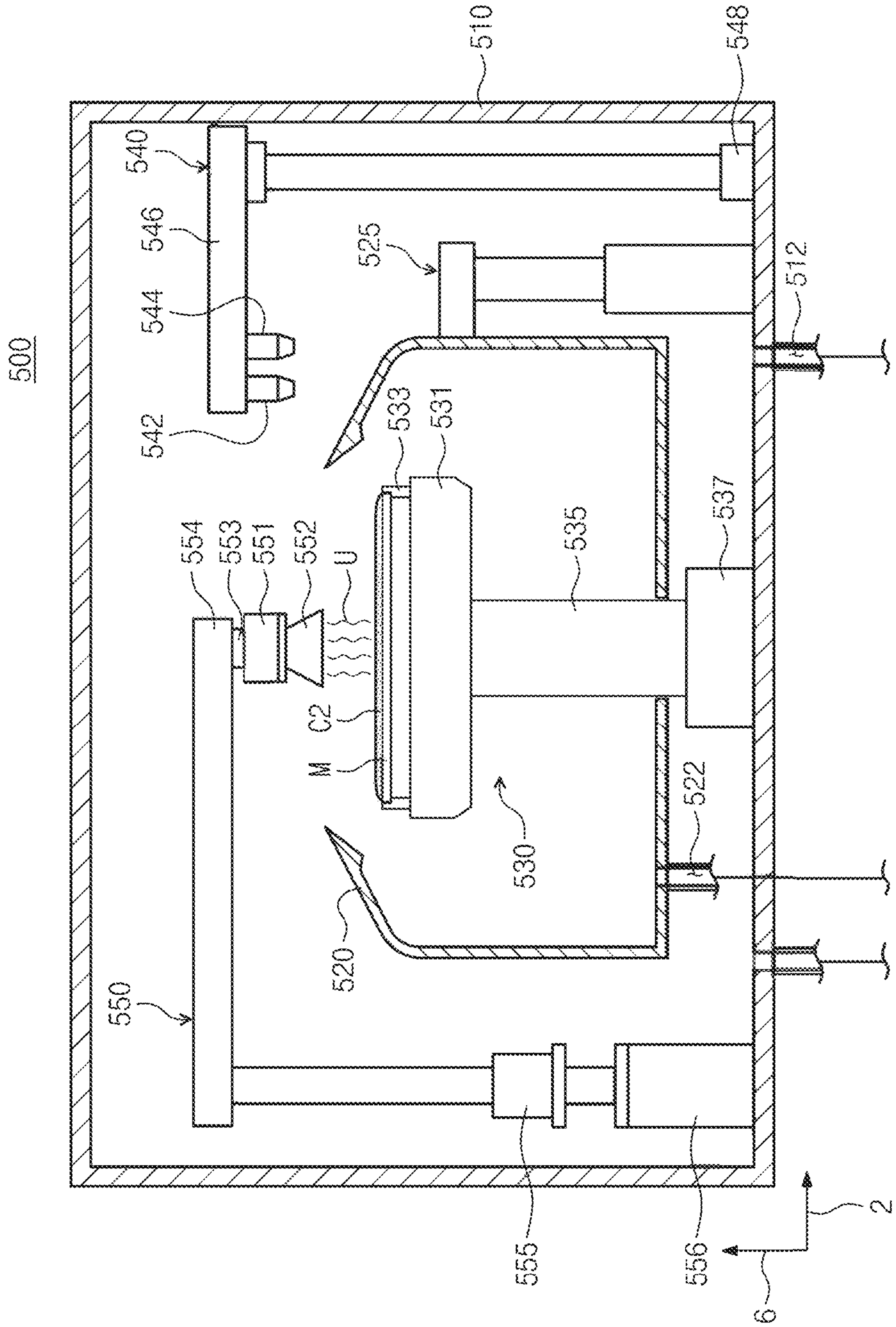

Subsequently, as shown in FIG. 17, the first ultrasonic nozzle 552 moves from the standby position to the ultrasonic application position. If the first ultrasonic nozzle 552 is completely moved to the ultrasonic application position, the first ultrasonic application unit 550 applies ultrasonic waves U (or a vibration energy) to the substrate M in which the second treating liquid C2 remains.

While the first ultrasonic application unit 550 applies the ultrasonic waves U to the substrate M, a position of the first ultrasonic nozzle 552 may be changed. Accordingly, ultrasonic waves U may be uniformly applied to the entire region of the substrate M. In addition, the first ultrasonic application unit 550 may change a frequency of the ultrasonic wave U in the process of applying the ultrasonic waves U to the substrate M. For example, by applying low-frequency ultrasonic waves U to the substrate M, a strength of a cavitation can be strengthened to remove the treatment residue of large particles remaining on the substrate M. In addition, by applying the ultrasonic waves U of a high frequency to the substrate M, the strength of the cavitation can be weakened and a density of the cavitation can be increased. If the density of the cavitation is increased, a penetration power of the ultrasonic waves U applied to the substrate M is improved, and thus the treatment residue of fine particles remaining on the substrate M may be removed. Accordingly, the first ultrasonic application unit 550 applies the ultrasonic waves U to the substrate M, thereby efficiently removing the treatment residue remaining on the substrate M. If the ultrasonic waves U are applied to the entire region of the substrate M, the first ultrasonic nozzle 552 moves from the ultrasonic application position to the standby position.

Figure 18:
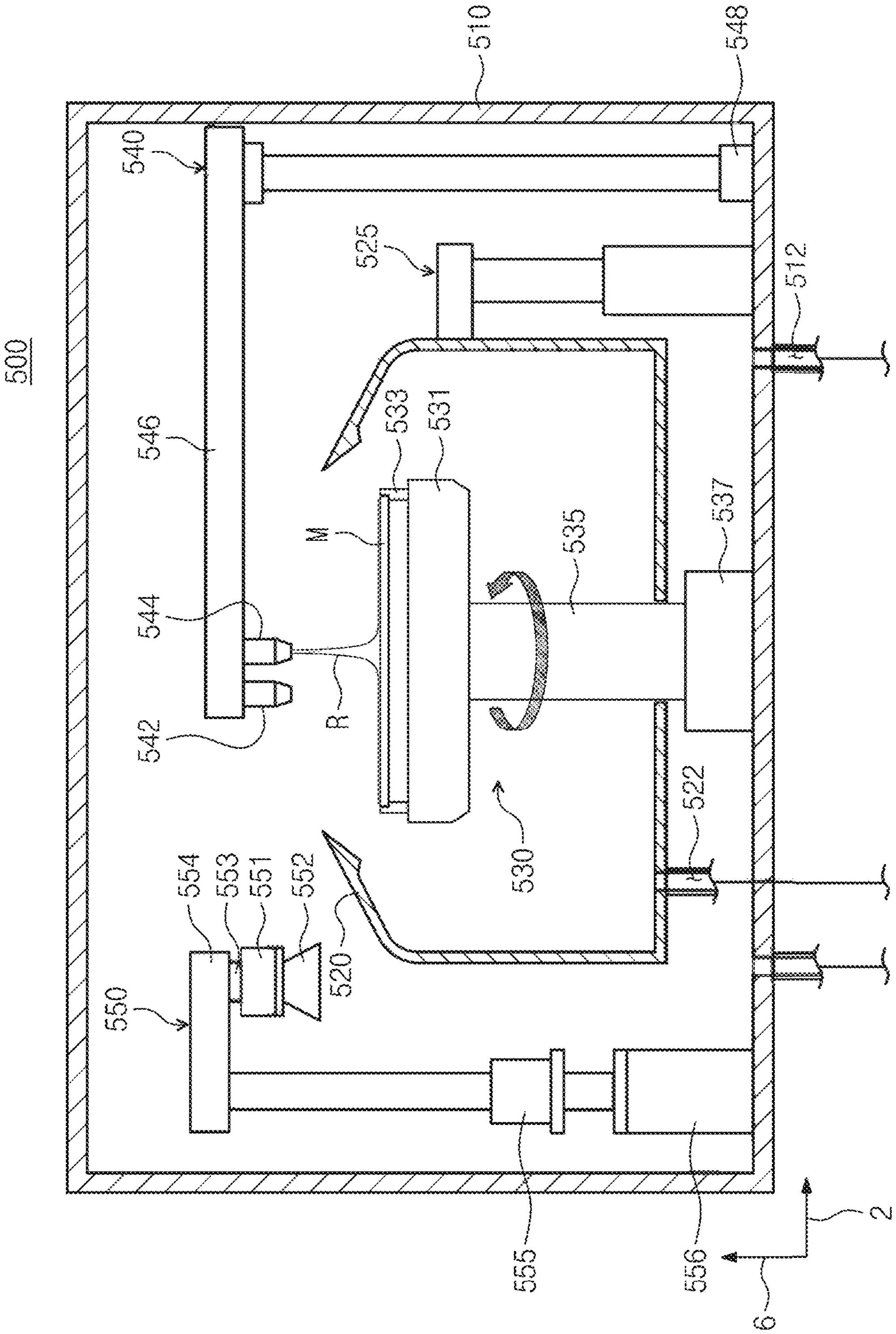

Subsequently, as shown in FIG. 18, the 2-2 nozzle 544 moves from the standby position to the liquid supply position. The 2-2 nozzle 544 supplies the rinsing liquid R to the substrate M. The rinsing liquid R supplied to the substrate M cleans the substrate M by replacing the second treating liquid remaining on the substrate M. In addition, the treatment residue on the substrate M generated by the second treating liquid and the ultrasonic waves can be removed from the substrate M by the rinsing liquid R supplied to the substrate M. If the rinsing liquid R is supplied to the substrate M in an amount satisfying the process condition, the 2-2 nozzle 544 stops supplying the rinsing liquid R, and the second support unit 530 stops rotating the substrate M. In addition, the nozzles 542 and 544 move from the liquid supply position to the standby position.

The transfer robot 320 transfers the substrate M from the second chamber 500 to the third chamber 600 (T3, third transfer). The substrate M on which the removal step S140 is completed in the second chamber 500 is transferred to the third chamber 600 in a state in which the rinsing liquid is wetted on the top surface thereof. Accordingly, it is possible to minimize a collapse of patterns formed on the substrate M.

Figure 19:
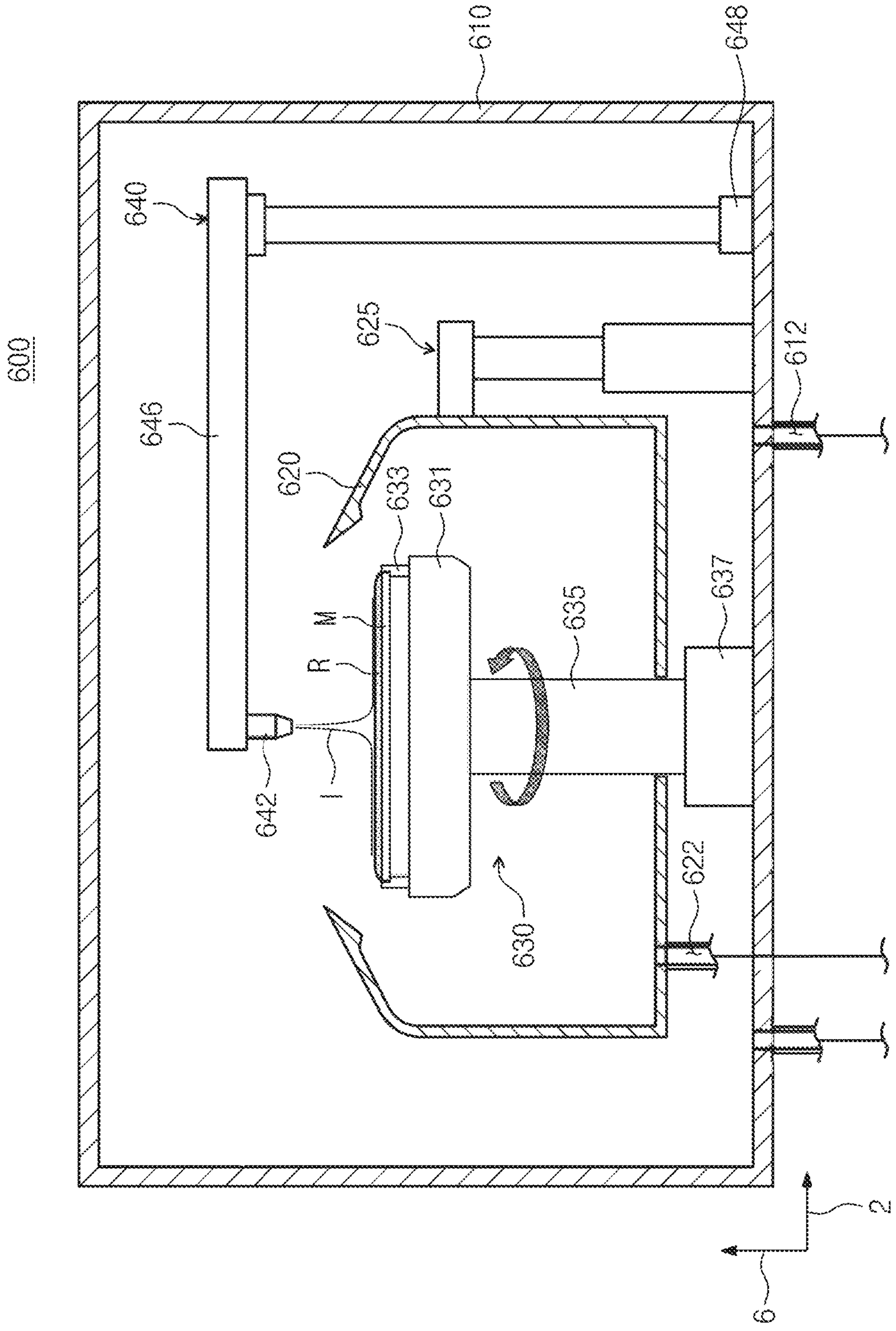
FIG. 19 schematically illustrates the third chamber performing a drying step according to an embodiment.

As shown in FIG. 19, if the substrate M in a state in which the rinsing liquid R is wetted is transferred to the third chamber 600 and the substrate M is supported by the third support unit 630, the drying step S160 is performed. In the drying step S160 the substrate M is dried. More specifically, the 3-1 nozzle 642 moves from the standby position to the liquid supply position. If the 3-1 nozzle 642 is completely moved to the liquid supply position, the 3-1 nozzle 642 supplies the organic solvent I to the rotating substrate M to dry the substrate M. According to an embodiment, the organic solvent may be an IPA.

The transfer robot 320 transfers the dried substrate M from the third chamber 600 to the fourth chamber 700 (T4, fourth transfer). If the substrate M is transferred to the fourth chamber 700, the etching step S20 is performed.

In the etching step S20, a specific region of the substrate M is etched. More specifically, the etching step S20 may be a fine critical dimension correction process (FCC) in a mask manufacturing process for an exposure process. The critical dimensions of the first pattern P1 and the second pattern P2 formed on the substrate M taken into the fourth chamber 700 may be different from each other. According to an embodiment, a critical dimension of the first pattern P1 may be relatively greater than a critical dimension of the second pattern P2. For example, the critical dimension of the first pattern P1 may be a first critical dimension (e.g., 69 nm), and the critical dimension of the second pattern P2 may be a second critical dimension (e.g., 68.5 nm). According to an embodiment, in the etching step S20, the second pattern P2 among the first pattern P1 and the second pattern P2 formed on the substrate M is locally etched.

The etching step S20 may include a pattern information checking step S220, an etchant supply step S240, a heating step S260, and a rinsing liquid supply step S280. The pattern information checking step S220, the etchant supply step S240, the heating step S260, and the rinsing liquid supply step S280 may be sequentially performed. In addition, the pattern information checking step S220, the etchant supply step S240, the heating step S260, and the rinsing liquid supply step S280 may all be performed in the fourth chamber 700.

In the pattern information checking step S220, a position information of a plurality of patterns formed on the substrate M is checked. In more detail, in the pattern information checking step S220, a position information of the exposure patterns EP formed on the substrate M, a position information of the first pattern P1, and/or a position information of the second pattern P2 may be checked. In addition, in the pattern information checking step S220, it is possible to check whether the substrate M supported by the fourth support unit 730 is distorted. In addition, it is possible to check whether, for example, the substrate M is supported at a correct position of the fourth support unit 730.

If the substrate M is supported by the fourth support unit 730, the optical module 750 moves from the standby position to the process position. If the optical module 750 is positioned at the process position, the imaging unit 830 acquires an image of the substrate M. According to an embodiment, the imaging unit 830 acquires the image of the substrate M including a reference mark AK (see FIG. 3) formed on the substrate M. From the image of the substrate M acquired by the imaging unit 830, the position information of the substrate M and the position information of the plurality of patterns formed on the substrate M may be checked. An information such as the position information of a plurality of patterns formed on the currently treated substrate M and horizontal and vertical lengths (size of the substrate) of the substrate M may be stored in the controller 30 in advance. That is, based on the position information previously stored in the controller 30, a position at which the respective patterns are formed may be checked (or specified) from the reference mark AK. Accordingly, based on positions of the identified patterns, a position at which the second pattern P2 requiring a local heating is formed may be specified. If a confirmation of the position information on the patterns formed on the substrate M is completed, the optical module 750 moves from the process position to the standby position.

If a liquid remains in the substrate M, a distortion may occur in the image of the substrate M acquired by the imaging unit 830. Accordingly, the above-described pattern information checking step S220 is performed after drying the substrate M in the drying step S160.

Figure 20:
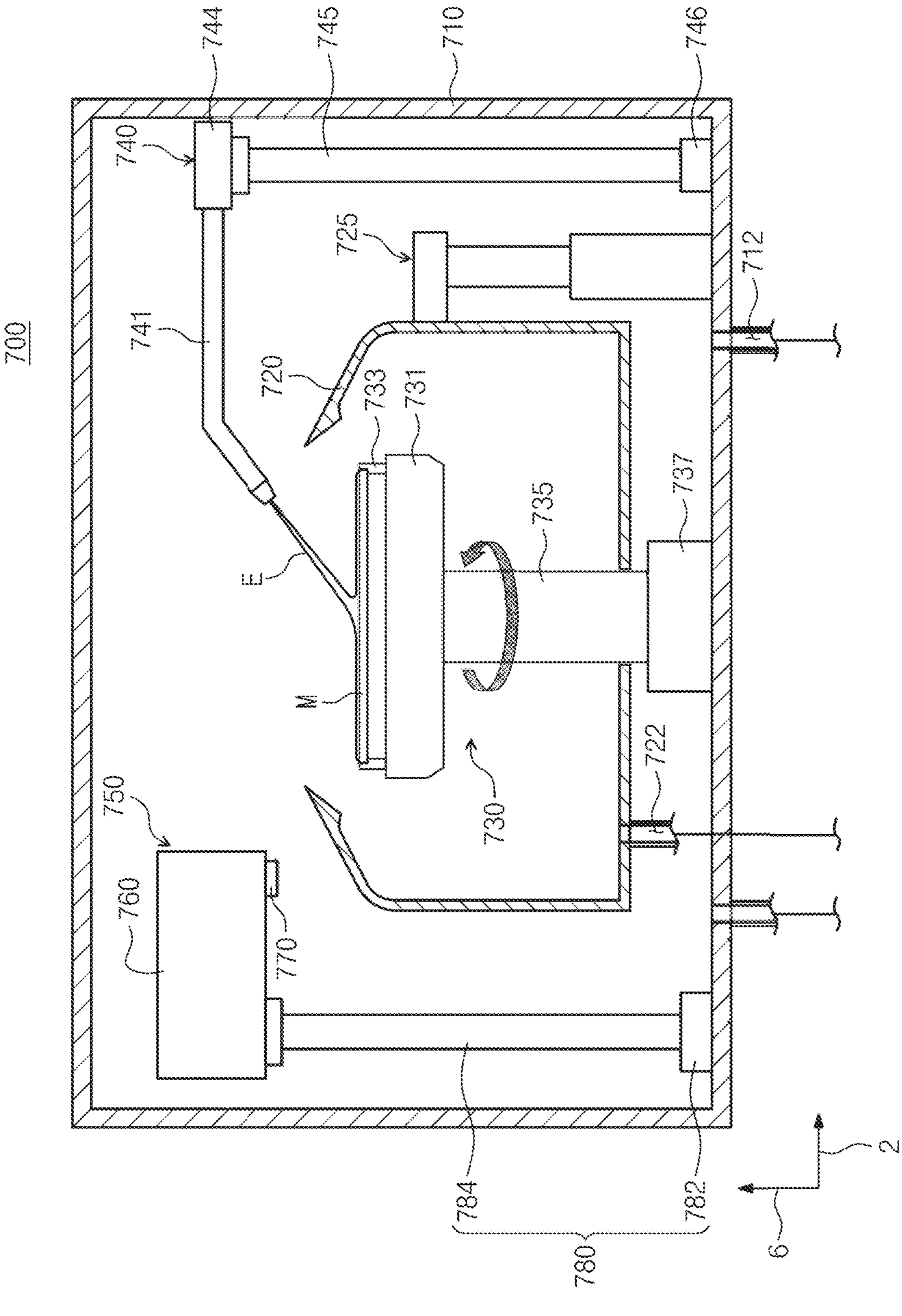
FIG. 20 to FIG. 22 sequentially illustrate the fourth chamber performing an etching step according to an embodiment.

Subsequently, as shown in FIG. 20, the 4-1 nozzle 741 moves from the standby position to the liquid supply position. If the 4-1 nozzle 741 is positioned at the liquid supply position, an etchant supply step S240 is performed. The 4-1 nozzle 741 supplies the etchant E to the substrate M. According to an embodiment, while the 4-1 nozzle 741 supplies the etchant E to the substrate M, the fourth support unit 730 may rotate. Alternatively, while the 4-1 nozzle 741 supplies the etchant E to the substrate M, the fourth support unit 730 may stop. In this case, the 4-1 nozzle 741 may supply a small amount of the etchant E to the substrate M. Here, the small amount may mean an amount to form a puddle on the top surface of the substrate M, but in an mount at which the etchant E does not flow out from the substrate M. If the etchant E satisfying the process condition is supplied to the substrate M, the 4-1 nozzle 741 moves from the liquid supply position to the standby position.

Figure 21:
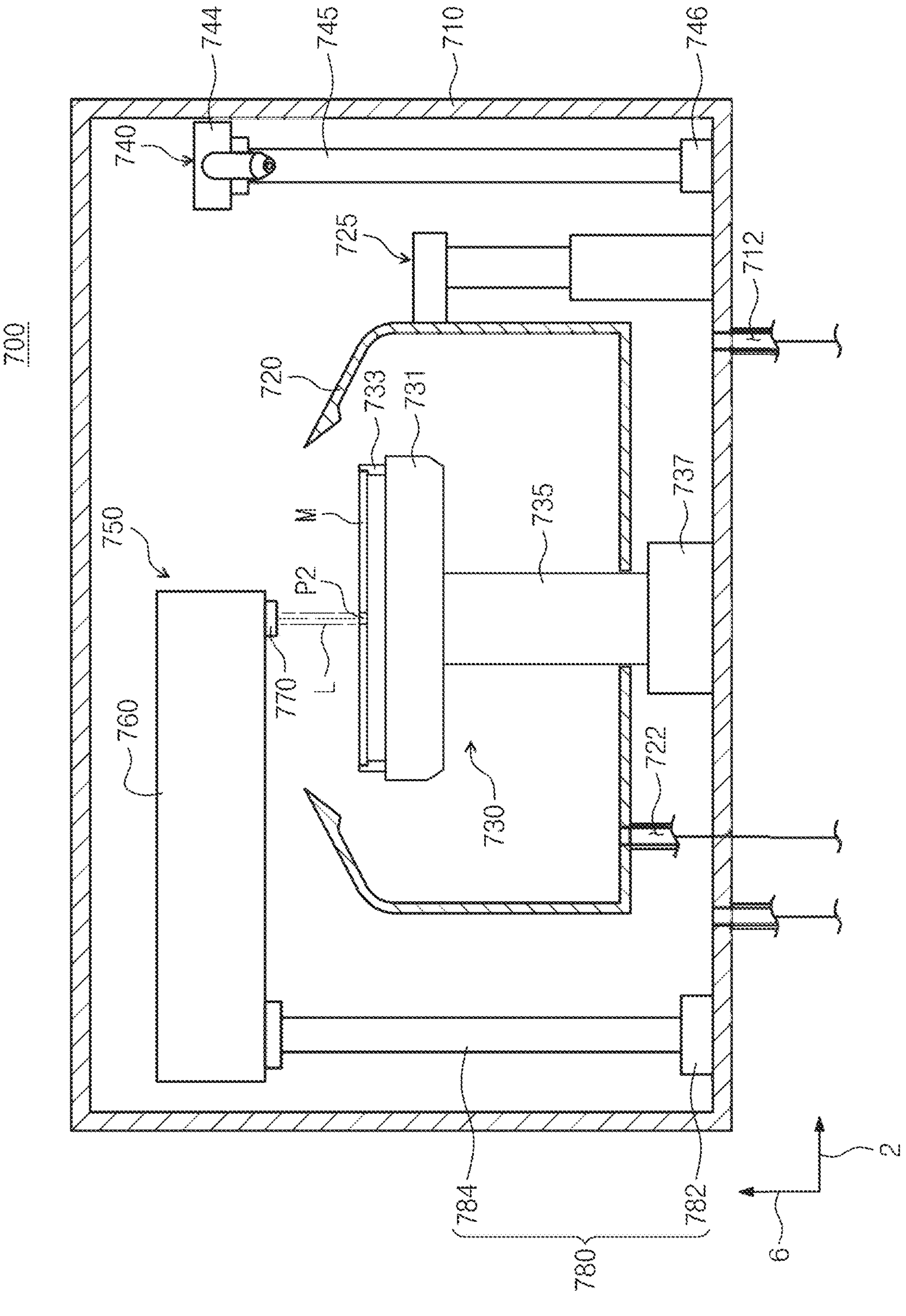

Subsequently, as shown in FIG. 21, the optical module 750 moves from the standby position to the process position again. If the optical module 750 is positioned at the process position, the heating step S260 is performed. The laser unit 810 irradiates the substrate M in which the etchant remains with the laser L. More specifically, when viewed from above, if the head nozzle 770 overlaps the second pattern P2 formed on the substrate M, the laser unit 810 irradiates the laser L toward the second pattern P2. A region in which the second pattern P2 irradiated with the laser L is formed is locally heated. Accordingly, a region at which the second pattern P2 is formed may have a relatively greater degree of etching by the etchant than other regions on the substrate M.

By the laser L locally irradiated to the second pattern P2, the critical dimension of the first pattern P1 may be changed from the first critical dimension (e.g., 69 nm) to a target critical dimension (e.g., 70 nm). In addition, the critical dimension of the second pattern P2 may change from the second critical dimension (e.g., 68.5 nm) to a target critical dimension (e.g., 70 nm). That is, in the etching step S240, an etching capability of the substrate M for a specific region may be improved to minimize a critical dimension deviation of the patterns formed on the substrate M. If a the deviation of the critical dimension of the patterns formed on the substrate M is minimized, the optical module 750 moves back from the process position to the standby position.

Figure 22:
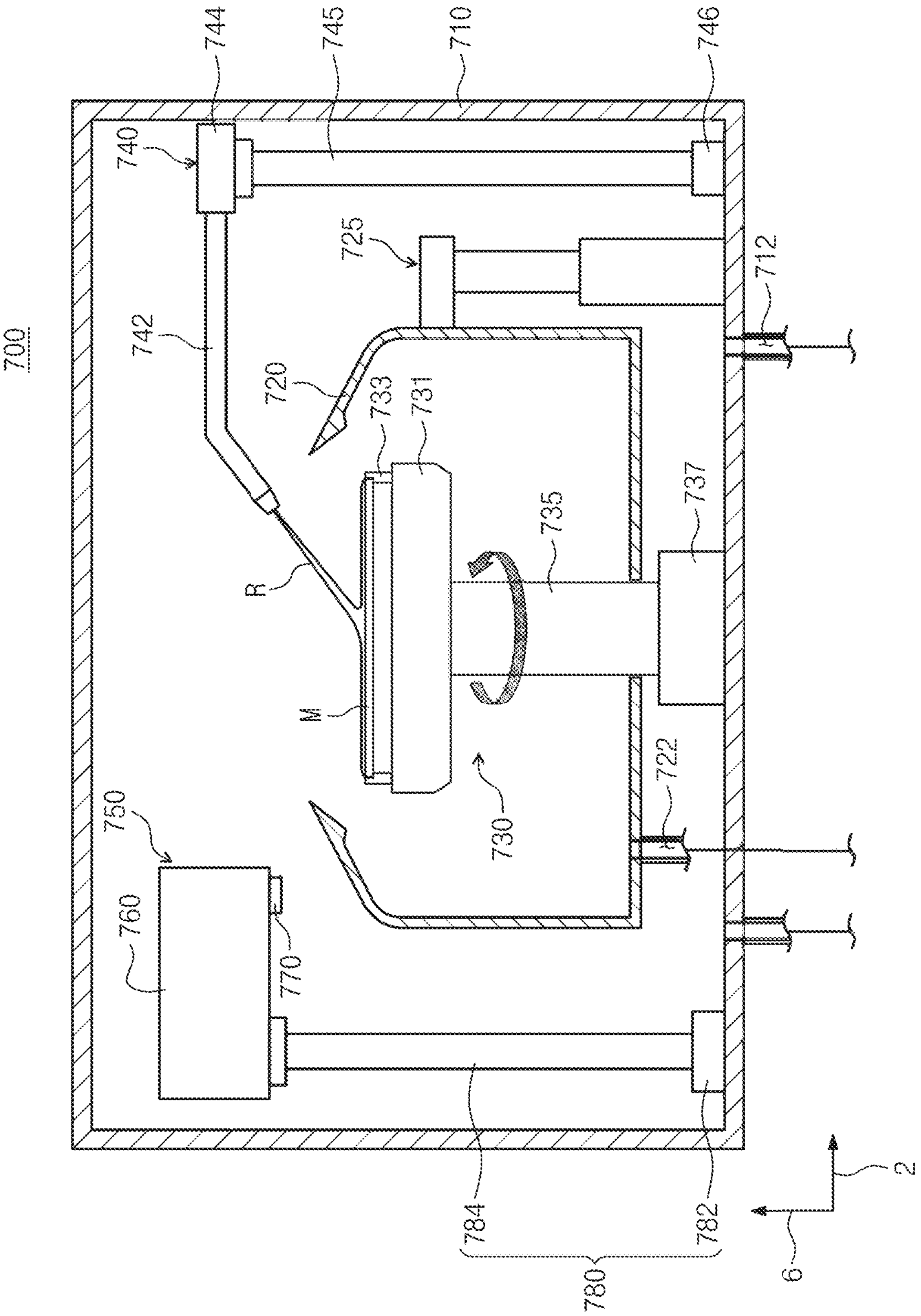

Subsequently, as shown in FIG. 22, the 4-2 nozzle 742 moves from the standby position to the liquid supply position. If the 4-2 nozzle 742 is positioned at the liquid supply position, a rinsing liquid supply step S280 is performed. The 4-2 nozzle 742 supplies the rinsing liquid R to the rotating substrate M. The rinsing liquid R supplied to the substrate M cleans the substrate M by replacing the etchant supplied in the above-described etchant supply step S240. In addition, the rinsing liquid R supplied to the substrate M removes etching foreign substances generated if the second pattern P2 is locally heated in the heating step S260 described above. If the rinsing liquid R is supplied to the substrate M by an amount satisfying the process condition, the 4-2 nozzle 742 stops supplying the rinsing liquid R, and the fourth support unit 730 stops rotating the substrate M. In addition, the nozzles 741 and 742 move from the liquid supply position to the standby position.

The transfer robot 320 transfers the substrate M from the fourth chamber 700 to the fifth chamber 900 (T5, fifth transfer). The substrate M is transferred to the fifth chamber 900 in a state in which the rinsing liquid is wetted. In the etching step S20, it is possible to minimize the occurrence of a leaning phenomenon on the substrate in which a critical dimension deviation of patterns is minimized.

If the substrate M is transferred to the fifth chamber 900, the post-treatment step S30 is performed. In the post-treatment step S30, the substrate M is post-treated. More specifically, in the post-treatment step S30, the etching residue generated in the process of performing the etching step S20 is removed from the substrate M to clean the substrate M. The post-treatment step S30 may include a second treating liquid supply step S320, an ultrasonic application step S340, a rinsing liquid supply step S360, and an organic solvent supply step S380. The second treating liquid supply step S320, the ultrasonic application step S340, the rinsing liquid supply step S360, and the organic solvent supply step S380 may be sequentially performed in the fifth chamber 900.

Figure 23:
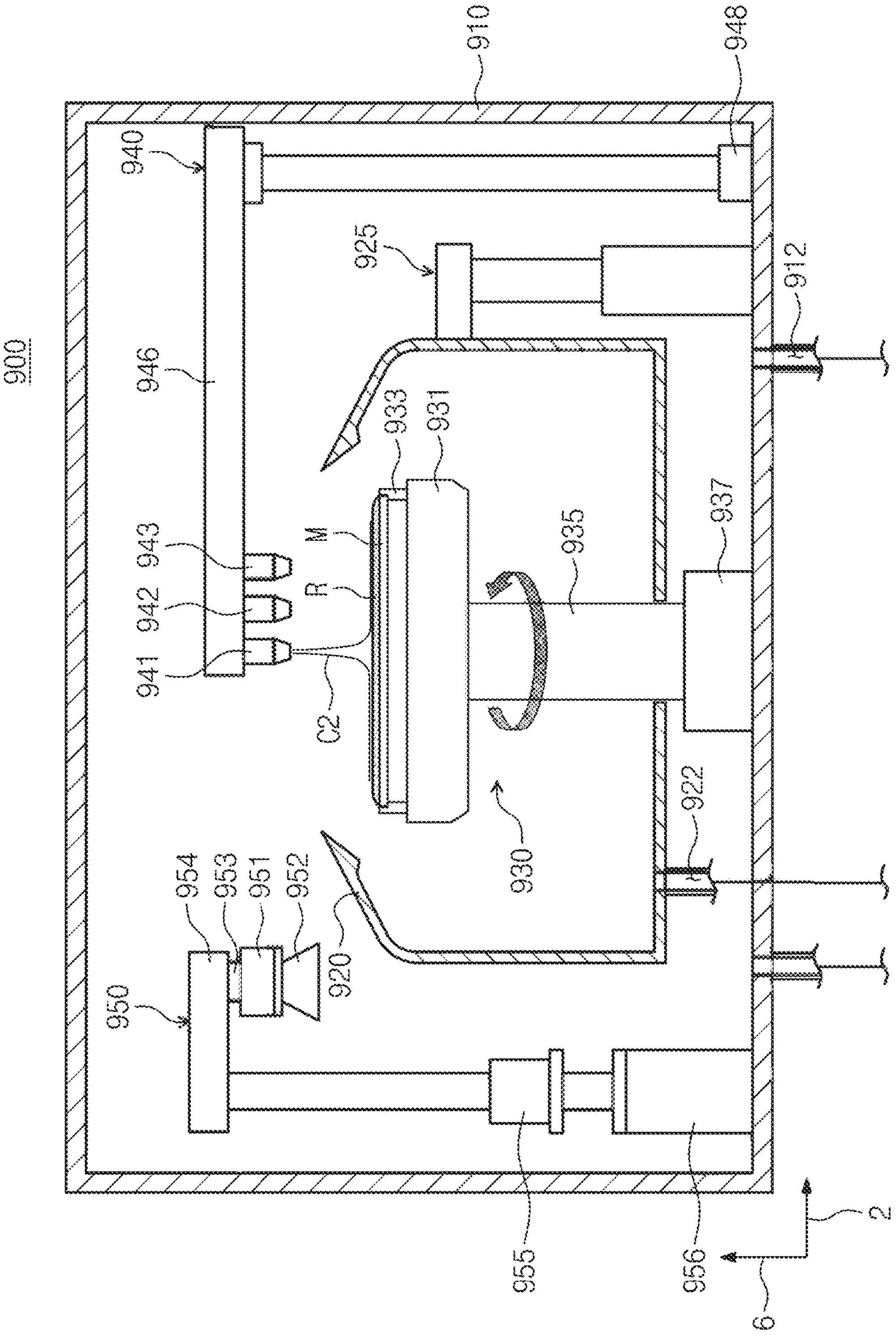
FIG. 23 to FIG. 26 sequentially illustrate the fifth chamber performing a post-treatment residue step according to an embodiment.

In the second treating liquid supply step S320, the second treating liquid is supplied onto the substrate M on which the rinsing liquid is wetted. More specifically, as shown in FIG. 23, the 5-1 nozzle 941 moves from the standby position to the liquid supply position. If the 5-1 nozzle 941 is positioned at the liquid supply position, the 5-1 nozzle 941 supplies the second treating liquid C2 to the rotating substrate M. According to an embodiment, the second treating liquid C2 may include an SC-1 liquid. In a process of performing the etching step S20, the etching residue generated by etching the second pattern P2 may be removed from the substrate M by the second treating liquid C2. If an amount of the second treating liquid C2 satisfying the process condition is supplied to the substrate M, the 5-1 nozzle 941 moves from the liquid supply position to the standby position.

Figure 24:
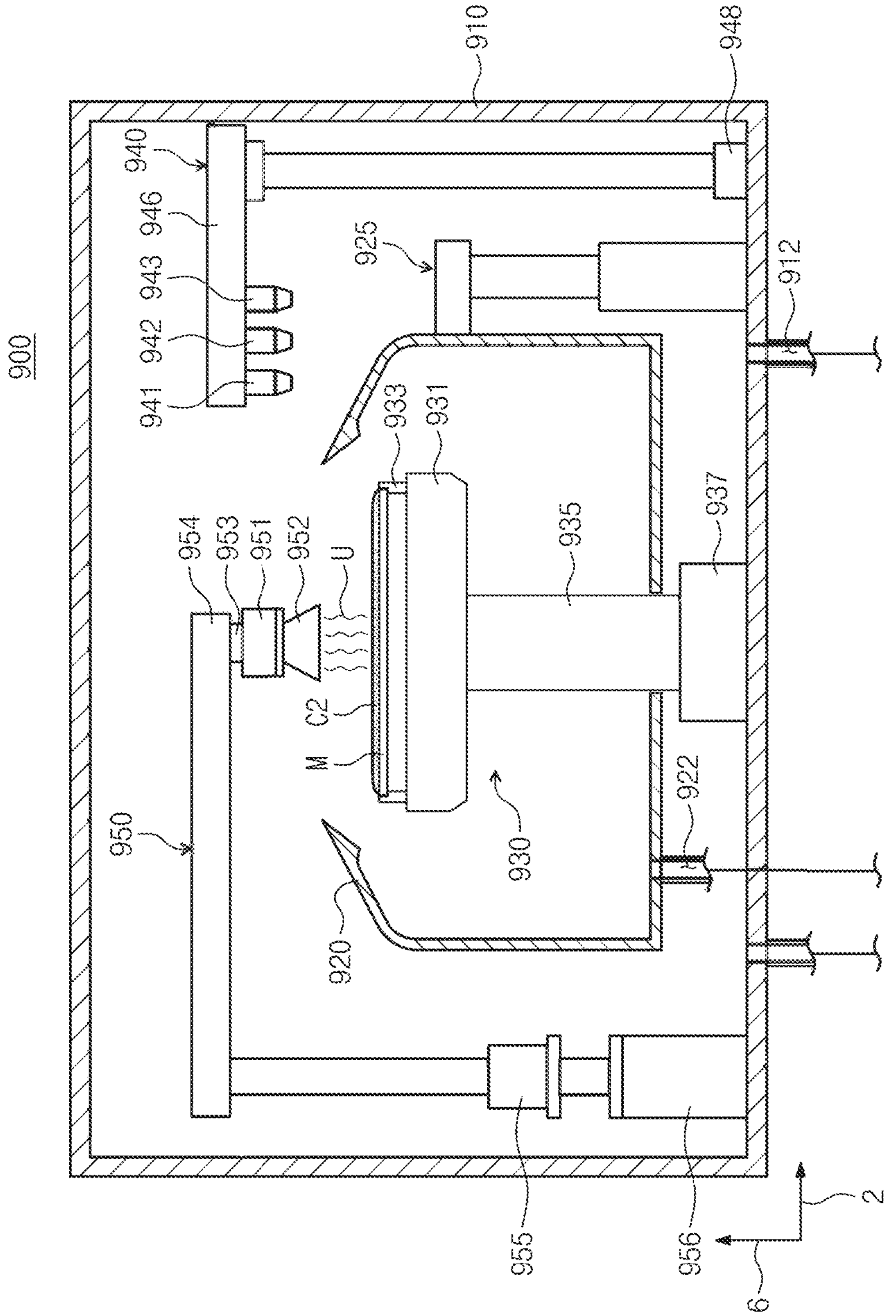

Subsequently, in the ultrasonic application step S340, ultrasonic waves (or vibration energy) are applied to the substrate M in which the second treating liquid remains. More specifically, as shown in FIG. 24, the second ultrasonic nozzle 952 moves from the standby position to the ultrasonic application position. If the second ultrasonic nozzle 952 is positioned in the ultrasonic application position, the second ultrasonic application unit 950 applies ultrasonic waves U to the substrate M in which the second treating liquid C2 remains. As the second ultrasonic application unit 950 applies the ultrasonic waves U to the substrate M, the etching residue remaining on the substrate M may be efficiently removed. While the second ultrasonic application unit 950 applies the ultrasonic waves U to the substrate M, a position of the second ultrasonic nozzle 952 may be continuously changed. In addition, in a process of applying the ultrasonic waves U to the substrate M, the second ultrasonic nozzle 952 may change a frequency of the ultrasonic waves U applied to the substrate M. If the ultrasonic waves U are applied to the entire region of the substrate M, the second ultrasonic nozzle 952 moves from the ultrasonic application position to the standby position.

Figure 25:
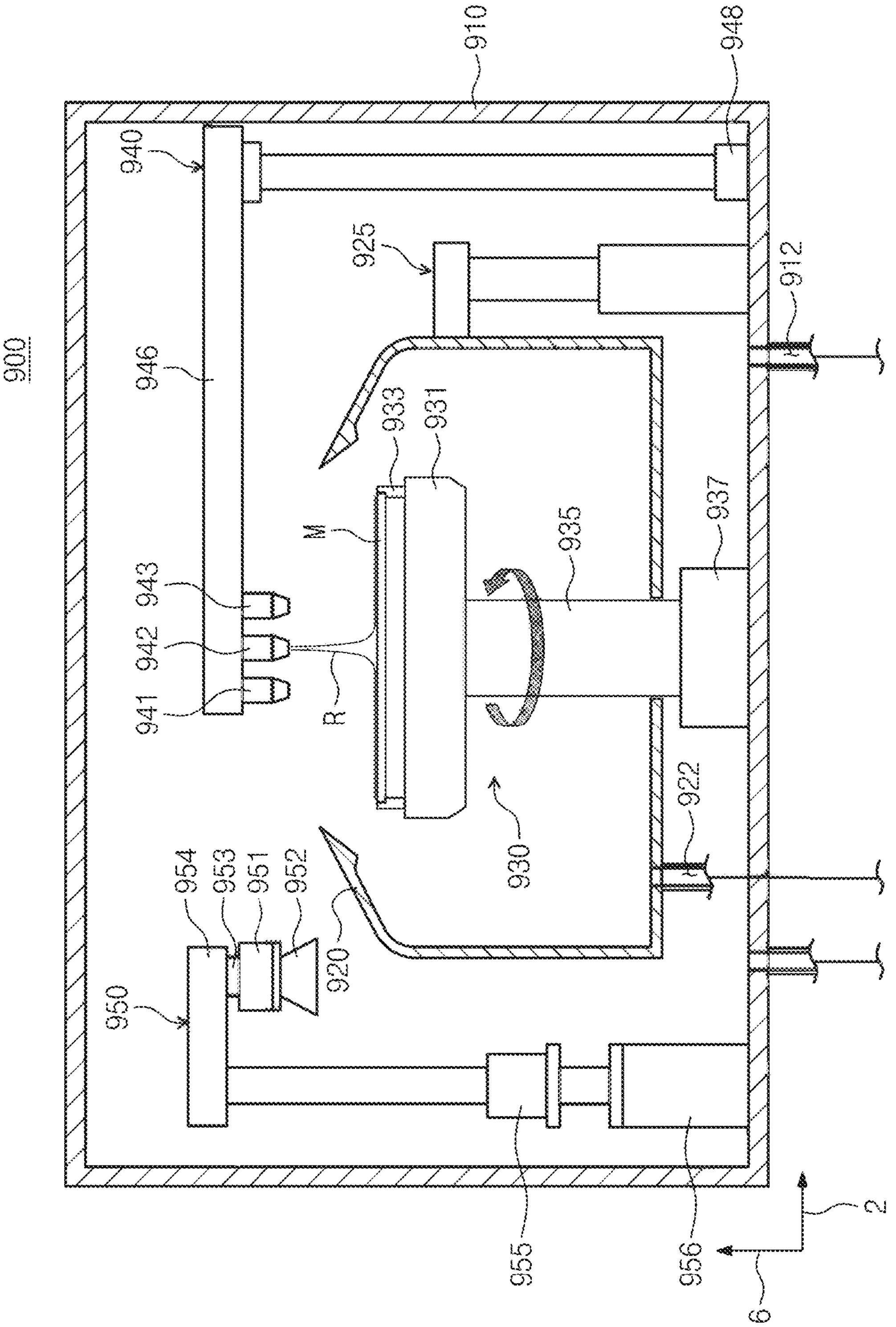

Subsequently, in the rinsing liquid supply step S360, the rinsing liquid is supplied to the substrate M. More specifically, as shown in FIG. 25, the 5-2 nozzle 942 moves from the standby position to the liquid supply position. The 5-2 nozzle 942 supplies the rinsing liquid R to the rotating substrate M. The rinsing liquid R according to an embodiment may be a deionized water or a deionized carbon dioxide water. The rinsing liquid R supplied to the substrate M may remove the remaining etching residue and the second treating liquid remaining on the substrate M from the substrate M.

Figure 26:
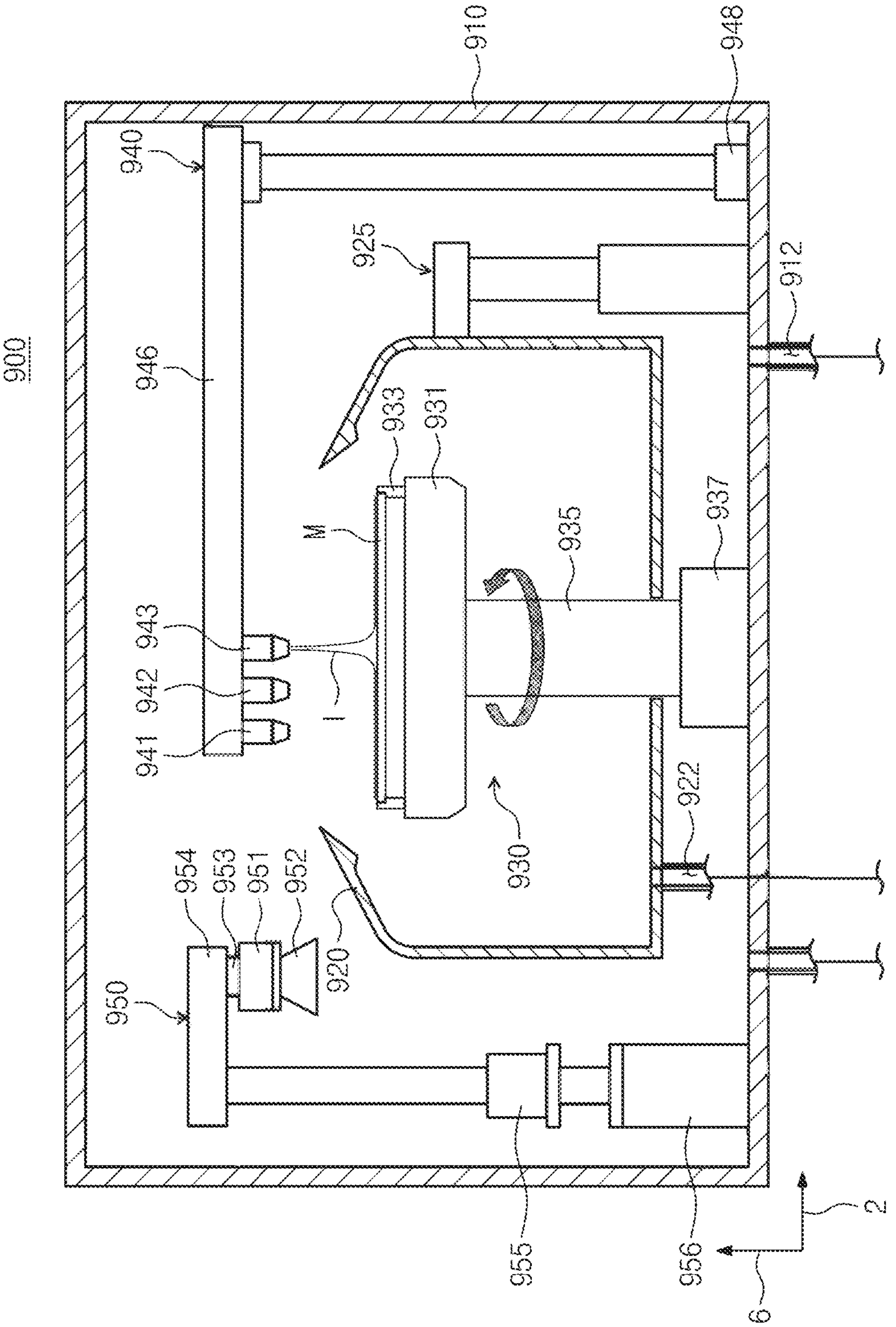

Subsequently, in the organic solvent supply step S380, the organic solvent is supplied to the substrate M. More specifically, as shown in FIG. 26, the 5-3 nozzle 943 supplies the organic solvent I to the rotating substrate M. The organic solvent I according to an embodiment may include an IPA liquid. The substrate M may be dried by the organic solvent I supplied by the 5-3 nozzle 943. If an amount of the organic solvent I satisfying the process condition is supplied to the substrate M, the 5-3 nozzle 943 moves to the standby position, and the substrate M is taken out from the fifth chamber 900 to complete a predetermined process.

If different types of liquids are supplied to the substrate M at time intervals in a same chamber, a preceding liquid may splatter back to components adjacent to the substrate M or the residue thereof may float therein. In this case, if a following liquid is supplied to the substrate M, a composition of the liquid is changed due to the preceding liquid, or different liquids overlap on the substrate M, causing defects in the substrate M treatment residue.

According to the above-described embodiment, the first chamber 400, the second chamber 500, the third chamber 600, the fourth chamber 700, and the fifth chamber 900 treats the substrate M using different liquids. If different liquids are used, different liquids may be supplied to the substrate M in separate chambers. Accordingly, since an inner environment suitable for each liquid may be created, a yield of a substrate M treatment may be improved. In particular, the fourth chamber 700 performs a so-called Fine Critical Dimension Correction (FCC) process which minimizes a critical dimension deviation of about several nm units between patterns. Accordingly, the substrate M can efficiently perform the etching step of locally and finely etching the second pattern P2 in the fourth chamber 700 in an optimal state (a state at which residues such as organic matter have been removed from the substrate) suitable for performing the critical dimension correction process.

In addition, according to the above-described embodiment, since the substrate M wetted with the rinsing liquid is transferred from the first chamber 400 to the second chamber 500, a pattern collapse can be prevented in a hydrophilic substrate M. In addition, since the substrate M wetted with the rinsing liquid is transferred from the second chamber 500 to the third chamber 600, patterns of the substrate M from which the treatment residue (e.g., organic matter) has been removed can be prevented from collapsing.

In addition, since the dried substrate M is transferred to the fourth chamber 700, a distortion-free image of the substrate M can be obtained at the fourth chamber 700. Accordingly, in the pattern information checking step S220, an exact position of the second pattern P2 may be checked. In addition, in the pattern information checking step S220, a laser can be accurately irradiated to the second pattern P2 in a subsequent heating step S260 by accurately checking whether the substrate M is distorted or supported in place.

In addition, since the substrate M wetted with the rinsing liquid is transferred to the fifth chamber 900 after the etching step S20 is performed, a pattern collapse can be minimized in the substrate M in which a critical dimension deviation is minimized.

Figure 27:
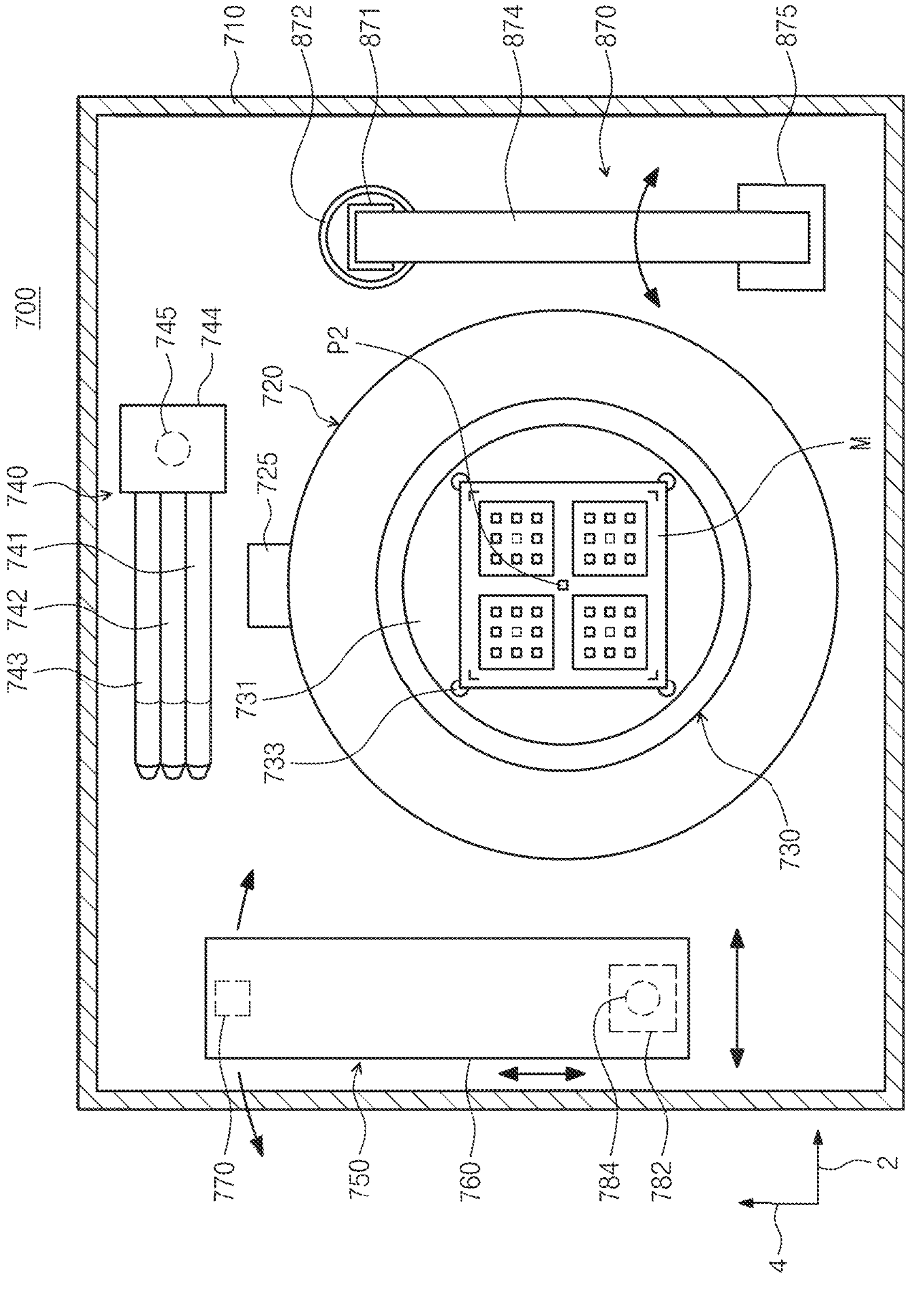
FIG. 27 is a view of the fourth chamber viewed from above according to another embodiment.
Figure 28:
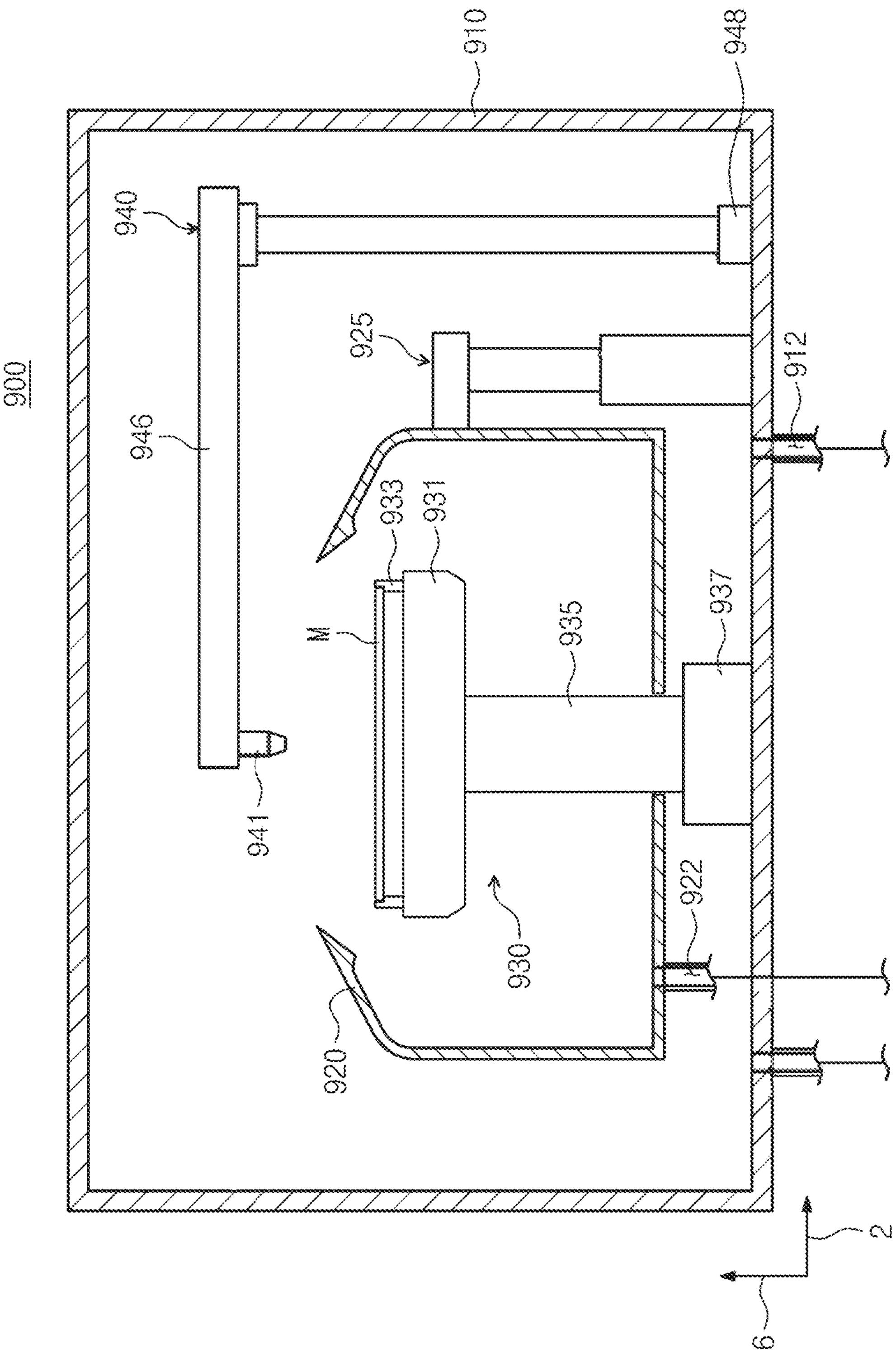
FIG. 28 is a cross-sectional view schematically illustrating the fifth chamber according to another embodiment.

FIG. 27 illustrates the fourth chamber viewed from above according to another embodiment. FIG. 28 is a cross-sectional view schematically illustrating the fifth chamber according to another embodiment.

Hereinafter, the fourth chamber and the fifth chamber according to another embodiment of the inventive concept will be described with reference to FIG. 27 and FIG. 28.

Referring to FIG. 27, the fourth chamber 700 may include a fourth housing 710, a fourth cup body 720, a fourth support unit 730, a fourth liquid supply unit 740, an optical module 750, and a third ultrasonic application unit 870. Since the fourth housing 710, the fourth cup body 720, the fourth support unit 730, and the optical module 750 are mostly the same as or similar to the above-described examples, a description of repeated descriptions will be omitted.

The fourth liquid supply unit 740 may further include a fourth-3 nozzle 743. The 4-3 nozzle 743 supplies the second treating liquid to the substrate M supported by the fourth support unit 730. According to an embodiment, the second treating liquid may include an SC-1 liquid.

The third ultrasonic application unit 870 applies ultrasonic waves (or vibration energy) to the substrate M supported by the fourth support unit 730. The third ultrasonic application unit 870 is disposed in the fourth housing 710. The third ultrasonic application unit 870 is disposed at a position which does not interfere with each other with the fourth liquid supply unit 740 and the optical module 750. The third ultrasonic application unit 870 includes a third cover 871, a third ultrasonic nozzle 872, a third cover arm 874, and a third motor 875. Since the third cover 871, the third ultrasonic nozzle 872, the third cover arm 874, and the third driver 875 are mostly the same as or similar to the structures of the first cover 551, the first ultrasonic nozzle 552, and the first cover arm 554, and the first drivers 555 and 556 respectively described with reference to FIG. 5, repeated descriptions will be omitted.

Referring to FIG. 28, the fifth liquid supply unit 940 may have only a single nozzle. According to an embodiment, the fifth liquid supply unit 940 may have only the 5-1 nozzle 941. The 5-1 nozzle 941 may supply an organic solvent to the substrate M supported by the fifth support unit 930. According to an embodiment, the organic solvent may include an IPA liquid.

Figure 29:
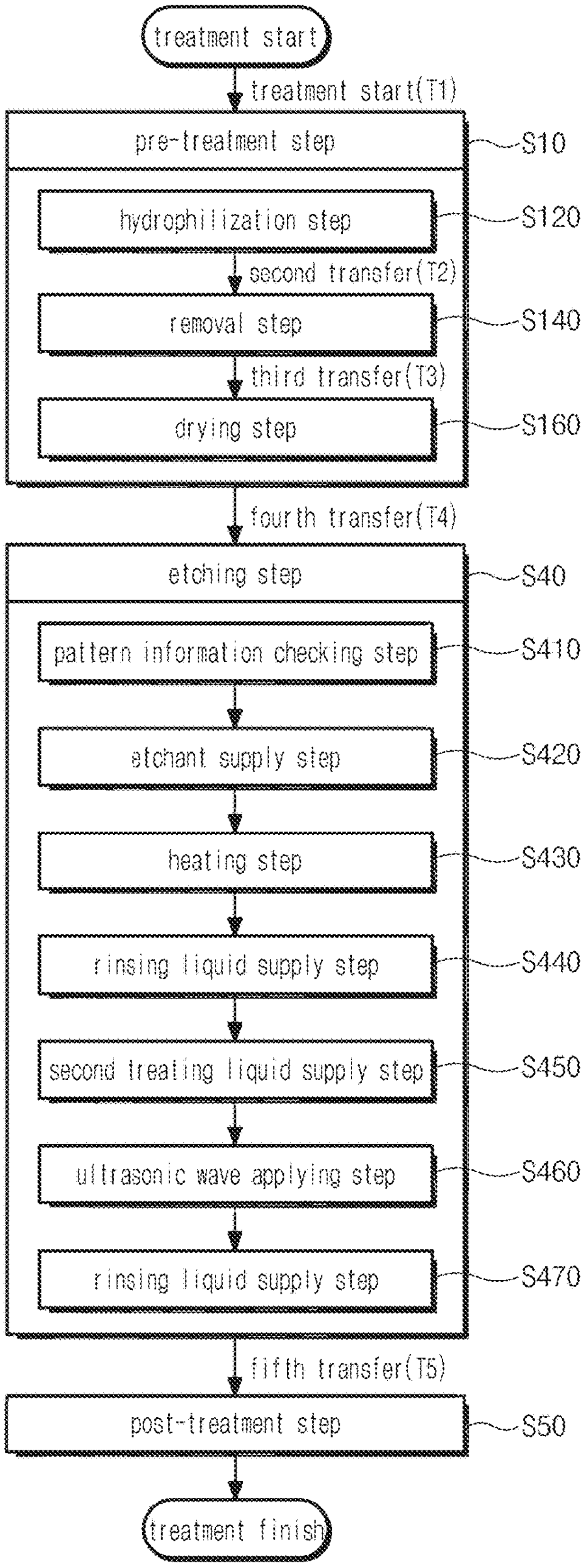
FIG. 29 is a flowchart of the substrate treating method according to another embodiment.

FIG. 29 is a flowchart of a substrate treating method according to another embodiment.

Some of the substrate treating methods described below are performed in the first chamber, the second chamber, and the third chamber described with reference to FIG. 1 to FIG. 6, and the other is performed in the fourth chamber and the fifth chamber described with reference to FIG. 27 and FIG. 28. Accordingly, reference numerals shown in FIG. 1 to FIG. 6, FIG. 27, and FIG. 28 are cited in the same manner below.

The substrate treating method according to an embodiment may include a pre-treatment step S10, an etching step S40, and a post-treatment step S50. The etching step S40 according to an embodiment may include a pattern information checking step S410, an etchant supply step S420, a heating step S430, a rinsing liquid supply step S440, a second treating liquid supply step S450, an ultrasonic wave applying step S460, and a rinsing liquid supply step S470. Each of the steps of the etching step S40 may be performed in the order of time series.

Since the pre-treatment step S10, the pattern information checking step S410, the etchant supply step S420, the heating step S430, and the rinsing liquid supply step S440 are performed using the same or similar mechanism as the substrate treating method according to an embodiment, description thereof will be omitted.

If a supply of the rinsing liquid to the substrate M is completed and the rinsing liquid supply step S440 is completed, the second treating liquid supply step S450 is performed. The 4-3 nozzle 743 supplies the second treating liquid to the rotating substrate M at the liquid supply position. Accordingly, the etching residue generated in the previous step, the etchant supply step S420, and the heating step S430, may be removed from the substrate M.

If the second treating liquid is supplied to the entire region of the substrate M, the ultrasonic wave application step S460 is performed. In this case, the 4-3 nozzle 743 moves from the liquid supply position to the standby position again, and the third ultrasonic nozzle 872 moves from the standby position to the ultrasonic application position. The third ultrasonic application unit 870 applies ultrasonic waves to the substrate in which the second treating liquid remains. In a process of applying ultrasonic waves, a position of the third ultrasonic nozzle 872 may be changed, and a frequency of ultrasonic waves applied to the substrate M may also be changed. The effect of the applied ultrasonic wave is as described above.

If ultrasonic waves are applied to the entire region of the substrate M, the rinsing liquid supply step S450 is performed. In this case, the third ultrasonic nozzle 872 moves from the ultrasonic application position to the standby position, and the 4-2 nozzle 742 moves from the standby position to the liquid supply position again. The 4-2 nozzle 742 supplies the rinsing liquid to the rotating substrate M. The rinsing liquid supplied to the substrate M removes the residue generated in a process of performing the previous steps, which are the second treating liquid supply step S450 and the ultrasonic application step S460, from the substrate M, and cleans the substrate M.

If the rinsing liquid supply step S450 is completed, the 4-2 nozzle 742 moves to the standby position, and the substrate M is transferred from the fourth chamber 700 to the fifth chamber 900. The substrate transferred to the fifth chamber 900 may be in a state in which the rinsing liquid is wetted on a top surface thereof. If the substrate M is transferred to the fifth chamber 900, the post-treatment residue step S50 is performed. In the post-treatment step S50, the 5-1 nozzle 941 supplies the organic solvent to the substrate M to dry the substrate M.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating method comprising:
pre-treating a substrate by cleaning the substrate;
etching the substrate by supplying an etchant and heating the substrate supplied with the etchant; and
post-treating the substrate after the etching the substrate,
wherein the pre-treating the substrate, the etching the substrate, and the post-treating the substrate are each performed in different chambers,
the substrate on which the pre-treating the substrate is completed is transferred in a dry state to a first chamber at which the etching the substrate is performed, and
the substrate on which the etching the substrate is completed is transferred in a wetted state with a liquid to a second chamber at which the post-treating the substrate is performed, and
wherein the etching the substrate includes locally irradiating a laser to a specific region of the substrate in a state at which the etchant remains on the substrate to etch the specific region of the substrate.

2. The substrate treating method of claim 1, wherein the etching the substrate further includes:
after locally irradiating the laser to the specific region of the substrate, replacing the etchant remaining on the substrate by supplying a rinsing liquid to the substrate.

3. The substrate treating method of claim 2, wherein the pre-treating the substrate includes:
hydrophilizing the substrate by supplying a first treating liquid to the substrate;
removing a treatment residue generated from the substrate at the hydrophilizing the substrate by supplying a second treating liquid to the substrate; and
drying the substrate,
wherein the hydrophilizing the substrate, the removing the treatment residue, and the drying the substrate are each performed in different chambers.

4. The substrate treating method of claim 3, wherein the post-treating the substrate includes:
supplying the second treating liquid to the substrate, applying an ultrasound to the substrate having the second treating liquid remaining thereon, to remove the rinsing liquid and an etching residue generated at the etching the substrate from the substrate.

5. The substrate treating method of claim 4, wherein the post-treating the substrate includes:
supplying the rinsing liquid after supplying the second treating liquid to the substrate to replace the second treating liquid with the rinsing liquid, and
supplying an organic solvent to the substrate after supplying the rinsing liquid to dry the substrate.

6. The substrate treating method of claim 3, wherein
at the hydrophilizing the substrate, the rinsing liquid is supplied to replace the first treating liquid with the rinsing liquid after the first treating liquid is supplied to the substrate,
at the removing the treatment residue, the rinsing liquid is supplied to replace the second treating liquid with the rinsing liquid after the second treating liquid is supplied to the substrate, and
the substrate which is wetted with the rinsing liquid is transferred from a third chamber at which the hydrophilizing the substrate is performed to a fourth chamber at which the removing the treatment residue is performed.

7. The substrate treating method of claim 6, wherein the substrate which is wetted with the rinsing liquid is transferred from the fourth chamber at which the removing the treatment residue is performed to a fifth chamber at which the drying the substrate is performed.

8. The substrate treating method of claim 3, wherein the removing the treatment residue includes applying an ultrasound to the substrate at which the second treating liquid remains after the second treating liquid is supplied to the substrate.

9. The substrate treating method of claim 3, wherein
the etching the substrate includes
supplying the second treating liquid to the substrate,
applying an ultrasound to the substrate at which the second treating liquid remains, and
re-supplying the rinsing liquid to replace the second treating liquid, after the rinsing liquid is supplied to the substrate, and
the post-treating the substrate includes
supplying an organic solvent to the substrate at which the rinsing liquid remains to dry the substrate.

10. The substrate treating method of claim 3, wherein
the first treating liquid, the second treating liquid, and the rinsing liquid each are supplied to a rotating substrate,
the first treating liquid includes an acid,
the second treating liquid includes a hydrogen peroxide (H2O2), and
the rinsing liquid includes a deionized water or a deionized carbon dioxide.

11. A substrate treating method comprising:
checking a position information of a plurality of patterns formed on a substrate;
supplying an etchant to the substrate;
heating a specific pattern among the plurality of patterns in a state of which the etchant remains on the substrate;
supplying a rinsing liquid to the substrate; and
post-treating by transferring the substrate on which the rinsing liquid has been supplied to a separate chamber to supply a liquid on the substrate, and to apply an ultrasound to the substrate having the liquid remaining thereon.

12. The substrate treating method of claim 11, wherein the checking the position information includes checking the position information of the specific pattern formed on the substrate.

13. The substrate treating method of claim 12, further comprising:

performing pre-treating the substrate before checking the position information of the plurality of patterns, and wherein the pre-treating includes hydrophilizing the substrate by supplying a first treating liquid to the substrate, and removing a treatment residue generated during a process of supplying the first treating liquid by supplying a second treating liquid.

14. The substrate treating method of claim 13, wherein the pre-treating includes:

applying the ultrasound to the substrate at which the second treating liquid remains, and drying the substrate by supplying an organic solvent to a rotating substrate.

15. The substrate treating method of claim 14, wherein the supplying the first treating liquid, the supplying the second treating liquid, and the supplying the organic solvent of the pre-treating are each performed in different chambers, and the checking the position information, the supplying the etchant, the heating the specific pattern, the supplying the rinsing liquid are performed in a same chamber.

16. The substrate treating method of claim 11, wherein the heating the specific pattern includes irradiating a laser to the specific pattern.

17. The substrate treating method of claim 11, wherein the substrate is a mask, and the mask has a first pattern and a second pattern which is different from the first pattern, the first pattern is formed within a plurality of cells which are formed on the mask, and the second pattern is formed outside of the plurality of cells, and the specific pattern is the second pattern.

18. The substrate treating method of claim 17, wherein the mask further includes a reference mark formed at an edge of the mask, and the checking the position information checks a position information of the reference mark, and checks a second position information of the second pattern with reference to the position information of the reference mark.

19. The substrate treating method of claim 11, wherein the post-treating includes:

applying the ultrasound to the substrate at which the liquid remains, and supplying the rinsing liquid and an organic solvent sequentially to the substrate.

* * * * *